United States Patent
Muguruma

(10) Patent No.: US 9,133,052 B2
(45) Date of Patent: Sep. 15, 2015

(54) GLASS PLATE FOR THIN FILM SOLAR CELL

(75) Inventor: Masato Muguruma, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 14/116,511

(22) PCT Filed: Apr. 25, 2012

(86) PCT No.: PCT/JP2012/061014
§ 371 (c)(1),
(2), (4) Date: Nov. 8, 2013

(87) PCT Pub. No.: WO2012/153634
PCT Pub. Date: Nov. 15, 2012

(65) Prior Publication Data
US 2014/0087935 A1    Mar. 27, 2014

(30) Foreign Application Priority Data

| May 10, 2011 | (JP) | 2011-104801 |
| May 10, 2011 | (JP) | 2011-104802 |
| Jun. 15, 2011 | (JP) | 2011-132963 |
| Feb. 15, 2012 | (JP) | 2012-030235 |
| Feb. 15, 2012 | (JP) | 2012-030287 |

(51) Int. Cl.
| C03C 3/085 | (2006.01) |
| C03C 3/078 | (2006.01) |
| C03C 3/093 | (2006.01) |
| C03C 3/087 | (2006.01) |
| H01L 31/0392 | (2006.01) |

(52) U.S. Cl.
CPC .............. *C03C 3/093* (2013.01); *C03C 3/087* (2013.01); *H01L 31/03923* (2013.01); *H01L 31/03925* (2013.01); *Y02E 10/541* (2013.01)

(58) Field of Classification Search
CPC ........ C03C 3/091; C03C 3/093; C03C 3/083; C03C 3/087; C03C 3/085; C03C 3/078; C03C 4/02; C03C 4/085
USPC .................. 501/66, 68, 69, 70, 72
See application file for complete search history.

(56) References Cited

U.S. PATENT DOCUMENTS

| 5,811,361 A | 9/1998 | Miwa | |
| 2003/0087746 A1* | 5/2003 | Ritter et al. | 501/66 |
| 2010/0129944 A1* | 5/2010 | Shimada et al. | 438/27 |
| 2010/0137122 A1* | 6/2010 | Nagai et al. | 501/70 |

FOREIGN PATENT DOCUMENTS

| JP | 11-135819 | 5/1999 |
| JP | 2987523 | 12/1999 |
| JP | 2005-089286 | 4/2005 |
| JP | 2008-280189 | 11/2008 |
| JP | 2010-059038 | 3/2010 |
| JP | 2010-180076 | 8/2010 |
| JP | 2011-121838 | 6/2011 |

OTHER PUBLICATIONS

International Preliminary Report on Patentability and Written Opinion of the International Searching Authority issued Nov. 21, 2013 in International (PCT) Application No. PCT/JP2012/061014.
International Search Report issued Jun. 12, 2012 in International (PCT) Application No. PCT/JP2012/061014.

* cited by examiner

*Primary Examiner* — Noah Wiese
(74) *Attorney, Agent, or Firm* — Wenderoth, Lind & Ponack, L.L.P.

(57) ABSTRACT

A glass sheet for a thin-film solar cell of the present invention is characterized by including, as a glass composition in terms of mass %, 45 to 60% of $SiO_2$, more than 8.0 to 18% of $Al_2O_3$, 0 to 15% (excluding 15%) of $B_2O_3$, 1 to 40% of MgO+CaO+SrO+BaO, and 1 to 30% of $Na_2O+K_2O$, and having a strain point of more than 580° C.

12 Claims, No Drawings

GLASS PLATE FOR THIN FILM SOLAR CELL

TECHNICAL FIELD

The present invention relates to a glass sheet for a thin-film solar cell, in particular, a glass sheet suitable for a CIS-based solar cell and a CdTe-based solar cell.

BACKGROUND ART

In a thin-film solar cell, for example, a CIS-based solar cell, Cu(InGa)Se$_2$, which is a chalcopyrite-type compound semiconductor comprising Cu, In, Ga, and Se, is formed as a photoelectric conversion film on a glass sheet.

In order to coat the top of a glass sheet with Cu, In, Ga, and Se and convert them into a chalcopyrite-type compound by using a multi-source deposition method, a selenization method, or the like, a heat treatment step at about 500 to 600° C. is required.

In a CdTe-based solar cell as well, a photoelectric conversion film comprising Cd and Te is formed on a glass substrate. In this case, a heat treatment step at about 500° C. to 600° C. is also required.

Soda-lime glass has been conventionally used as a glass substrate in a CIS-based solar cell, a CdTe-based solar cell, or the like. However, soda-lime glass is liable to have thermal deformation and thermal shrinkage in a heat treatment step at high temperature. In order to solve the problem, the use of high strain point glass has been currently studied (see Patent Literature 1).

In the meantime, a PDP is manufactured as described below. First, a transparent electrode such as an ITO film or an NESA film is formed on a surface of a front glass sheet, a dielectric layer is formed thereon, an electrode made of, for example, Al, Ag, or Ni is formed on a surface of a back glass sheet, a dielectric layer is formed thereon, and in addition, a dividing wall is formed thereon. Next, the front glass sheet and the back glass sheet are opposed to each other to position the electrodes and the like, and then the outer peripheral edge portions of the front glass sheet and back glass sheet are subjected to frit sealing in the temperature region of 450 to 550° C. After that, the air inside the resultant panel is evacuated to create a vacuum through an exhaust pipe and a noble gas is introduced into the panel, followed by sealing.

In the past, a glass sheet into which soda-lime glass (having a thermal expansion coefficient of about 84×10$^{-7}$/° C.) was formed so as to have a thickness of 1.5 to 3.0 mm by a float method or the like was used in a PDP. However, soda-lime glass has a strain point of about 500° C., and hence is liable to have thermal deformation and thermal shrinkage in a heat treatment step. Thus, a glass sheet having the same thermal expansion coefficient as that of soda-lime glass and having a higher strain point has been currently used (see Patent Literature 2).

CITATION LIST

Patent Literature

[PTL 1]: JP 11-135819 A
[PTL 2]: JP 2005-89286 A
[PTL 3]: JP 2987523 B

SUMMARY OF INVENTION

Technical Problem

In a CIS-based solar cell or a CdTe-based solar cell, the formation of a photoelectric conversion film at high temperature contributes to improving the crystal quality of the photoelectric conversion film, probably leading to the enhancement of the photoelectric conversion efficiency thereof. However, the high strain point glass disclosed in Patent Literature 1 did not have a sufficiently high strain point, and hence, when the film formation temperature of a photoelectric conversion film was more than 600 and 650° C. or less, the high strain point glass was liable to have thermal deformation and thermal shrinkage, with the result that the photoelectric conversion efficiency thereof could not be enhanced sufficiently.

On the other hand, Patent Literature 2 discloses a glass sheet having a strain point of more than 600 to 650° C. However, this glass sheet has too low a thermal expansion coefficient, and hence the thermal expansion coefficient does not match those of an electrode film and photoelectric conversion film in a thin-film solar cell, thus easily causing a defect such as film peeling. In addition, this glass sheet has too high a viscosity at high temperature, thus having a high melting temperature and a high forming temperature. As a result, the production cost of the glass sheet cannot be reduced.

Further, in a CIS-based solar cell, when an alkali component, in particular, Na$_2$O diffuses from a glass substrate, a chalcopyrite crystal easily precipitates. However, when the content of an alkali component, in particular, Na$_2$O is too low in a glass substrate, the following problem arises: a photoelectric conversion film having high quality cannot be formed thereon, and the photoelectric conversion efficiency thereof cannot be enhanced (see Patent Literature 3).

Thus, a technical object (hereinafter referred to as a first technical object) of the present invention is to provide a glass sheet which has a sufficiently high strain point and a thermal expansion coefficient matching those of peripheral members and on which a photoelectric conversion film having high quality can be formed.

Note that an object of the related invention of the present invention is as described below. That is, as described by taking a PDP as an example, increasing the strain point of a glass sheet enables the reduction of the thermal shrinkage and thermal deformation of the glass sheet. Further, when a glass sheet is formed by a float method, the temperature history of the glass sheet changes with variations in operational conditions of a float bath, with the result that the degrees of the thermal shrinkage and thermal deformation of the glass sheet are liable to vary randomly. Increasing the strain point of a glass sheet is also an effective method to cope with this problem.

However, the glass sheet disclosed in Patent Literature 2 does not have a sufficiently high strain point (600° C. or less), and hence the problems with thermal shrinkage and thermal deformation cannot be fully eliminated.

On the other hand, Patent Literature 3 discloses a glass sheet having a strain point of more than 600 to 650° C. However, this glass sheet has too low a thermal expansion coefficient, and hence the thermal expansion coefficient does not match those of peripheral members such as a seal frit, thus easily causing a defect such as a sealing failure. In addition, this glass sheet has too high a viscosity at high temperature, thus having a high melting temperature and a high forming temperature. As a result, the production cost of the glass sheet cannot be reduced.

Thus, a technical object (hereinafter referred to as a second technical object) of the present invention is to conceive a glass (in particular, a glass sheet) which has a sufficiently high strain point, and a thermal expansion coefficient matching those of peripheral members, and a low viscosity at high temperature.

Solution to Problem

The inventor of the present invention has made intensive studies and has consequently found that the above-mentioned first technical object can be achieved by controlling the glass composition and glass characteristics of a glass sheet in respective predetermined ranges. Thus, the finding is proposed as the present invention. That is, a glass sheet for a thin-film solar cell of the present invention is characterized by comprising, as a glass composition in terms of mass %, 45 to 60% of $SiO_2$, more than 8.0 to 18% of $Al_2O_3$, 0 to 15% (excluding 15%) of $B_2O_3$, 1 to 40% of MgO+CaO+SrO+BaO, and 1 to 30% of $Na_2O+K_2O$, and having a strain point of more than 580° C. Herein, the term "MgO+CaO+SrO+BaO" refers to the total amount of MgO, CaO, SrO, and BaO, the term "$Na_2O+K_2O$" refers to the total amount of $Na_2O$ and $K_2O$, and the term "strain point" refers to a value measured on the basis of ASTM C336-71.

In the glass sheet for a thin-film solar cell of the present invention, the range of the glass composition is controlled as described above. As a result, the strain point is likely to rise and the thermal expansion coefficient is likely to match those of peripheral members. Further, the glass sheet is likely to have a temperature at $10^{4.0}$ dPa·s of less than 1,200° C. and a liquidus viscosity of $10^{4.0}$ dPa·s or more.

Further, the glass sheet for a thin-film solar cell of the present invention has a strain point of more than 580° C. As a result, a photoelectric conversion film is likely to be formed thereon at high temperature, the crystal quality of the photoelectric conversion film is improved, and the glass sheet is difficult to have thermal deformation and thermal shrinkage. Consequently, the photoelectric conversion efficiency of the resultant thin-film solar cell can be enhanced sufficiently.

Second, the glass sheet for a thin-film solar cell of the present invention preferably has a mass ratio $Na_2O/(MgO+CaO+SrO+BaO+Li_2O+Na_2O+K_2O)$ of 0.05 to 0.5. Herein, the term "$MgO+CaO+SrO+BaO+Li_2O+Na_2O+K_2O$" refers to the total amount of MgO, CaO, SrO, BaO, $Li_2O$, $Na_2O$, and $K_2O$.

Third, the glass sheet for a thin-film solar cell of the present invention preferably has 28 to 50% of $SiO_2$—$Al_2O_3$, comprises 15 to 40% of MgO+CaO+SrO+BaO and 0 to 10% of MgO+CaO, has a mass ratio CaO/MgO of more than 1.0, and comprises 0 to 30% of CaO+SrO. Herein, the term "$SiO_2$—$Al_2O_3$" refers to a value obtained by subtracting the content of $Al_2O_3$ from the content of $SiO_2$, the term "MgO+CaO" refers to the total amount of MgO and CaO, and the term "CaO+SrO" refers to the total amount of CaO and SrO.

Fourth, the glass sheet for a thin-film solar cell of the present invention preferably further comprises 0.01 to 1% of $Fe_2O_3$.

Fifth, the glass sheet for a thin-film solar cell of the present invention preferably further comprises 0.01 to 1% of $SO_3$ and is preferably formed by a float method.

Sixth, the glass sheet for a thin-film solar cell of the present invention preferably has a strain point of more than 600 to 650° C.

Seventh, the glass sheet for a thin-film solar cell of the present invention preferably has a thermal expansion coefficient of 70 to $100 \times 10^{-7}/°$ C. Herein, the "thermal expansion coefficient" refers to an average thermal expansion coefficient in the range of 30 to 380° C. calculated from the values obtained by measurement with a dilatometer.

Eighth, the glass sheet for a thin-film solar cell of the present invention preferably has a temperature at $10^{4.0}$ dPa·s of 1,200° C. or less. Herein, the "temperature at $10^{4.0}$ dPa·s" refers to a value measured by a platinum sphere pull up method.

Ninth, the glass sheet for a thin-film solar cell of the present invention preferably has a liquidus viscosity of $10^{4.0}$ dPa·s or more. Herein, the "liquidus viscosity" refers to a value obtained by measuring the viscosity of glass at a liquidus temperature by a platinum sphere pull up method. The "liquidus temperature" refers to a value obtained by measuring a temperature at which crystals of glass are deposited after glass powder that passed through a standard 30-mesh sieve (500 μm) and remained on a 50-mesh sieve (300 μm) is placed in a platinum boat and then the platinum boat is kept for 24 hours in a gradient heating furnace.

Tenth, the glass sheet for a thin-film solar cell of the present invention preferably comprises a film having a thermal expansion coefficient of 60 to $120 \times 10^{-7}/°$ C. and formed at a film formation temperature of 500 to 700° C. As a result, the crystal quality of the photoelectric conversion film is improved, and the photoelectric conversion efficiency of the resultant thin-film solar cell can be enhanced. In addition, the thermal expansion coefficient of the glass sheet and that of the film are likely to be matched to each other.

Eleventh, the glass sheet for a thin-film solar cell of the present invention preferably undergoes no chemical tempering treatment.

Twelfth, the glass sheet for a thin-film solar cell of the present invention is preferably used in a CIS-based solar cell.

Thirteenth, the glass sheet for a thin-film solar cell of the present invention is preferably used in a CdTe-based solar cell.

In addition, the inventor of the present invention has made intensive studies and has consequently found that the above-mentioned second technical object can be achieved by controlling the glass composition of a glass sheet in a predetermined range. Thus, the finding is proposed as the related invention of the present invention. That is, the glass of the related invention comprises, as a glass composition in terms of mass %, 45 to 55% (excluding 55%) of $SiO_2$, more than 10.0 to 15% of $Al_2O_3$, 0 to 15% of $B_2O_3$, 0 to less than 3.7% of MgO, more than 2.9 to 8% of CaO, more than 4.0 to 15% of SrO, more than 2.0 to less than 14% (excluding 14.0%) of BaO, 0 to 10% of $Li_2O$, more than 4.0 to 15% of $Na_2O$, 0 to 10% of $K_2O$, 0 to 7% of $ZrO_2$, and 0.01 to 1% of $Fe_2O_3$.

The glass composition range of the glass of the related invention is restricted as described above. The restriction makes the following easy: achievements of a strain point of more than 600 to 650° C., a thermal expansion coefficient of 70 to $100 \times 10^{-7}/°$ C., a temperature at $10^{4.0}$ dPa·s of less than 1,200° C., and a liquidus viscosity of $10^{4.0}$ dPa·s or more.

Second, the glass of the related invention preferably has a glass composition in which in terms of mass % of the following oxides, $SiO_2$—$Al_2O_3$ is 30 to 45% (excluding 45%), MgO+CaO+SrO+BaO is more than 17.0 to 40%, MgO+CaO is more than 2.9 to 10%, a mass ratio of CaO/MgO is more than 1.0, CaO+SrO is 6.92 to 23%, and a mass ratio of $Na_2O/(MgO+CaO+SrO+BaO+Li_2O+Na_2O+K_2O)$ is 0.137 to 0.355, as the glass composition. Herein, the term "$SiO_2$—$Al_2O_3$" refers to a value obtained by subtracting the content of $Al_2O_3$ from the content of $SiO_2$, the term "MgO+CaO+SrO+BaO" refers to the total amount of MgO, CaO, SrO, and BaO, the term "MgO+CaO" refers to the total amount of MgO and CaO, the term "CaO+SrO" refers to the total amount of CaO and SrO, and the term "MgO+CaO+SrO+BaO+Li$_2$O+Na$_2$O+ K$_2$O" refers to the total amount of MgO, CaO, SrO, BaO, Li$_2$O, Na$_2$O, and K$_2$O.

Third, the glass of the related invention preferably further comprises 0.01 to 1 mass % of SO$_3$ and is preferably formed by a float method.

Fourth, the glass of the related invention preferably has a strain point of more than 600 to 650° C. The "strain point" refers to a value measured on the basis of ASTM C336-71.

Fifth, the glass of the related invention preferably has a thermal expansion coefficient of $70\times10^{-7}$ to $100\times10^{-7}$/° C. Herein, the "thermal expansion coefficient" refers to an average thermal expansion coefficient in the range of 30 to 380° C. calculated from the values obtained by measurement with a dilatometer.

Sixth, the glass of the related invention preferably has a temperature at $10^{4.0}$ dPa·s of 1,200° C. or less. Herein, the "temperature at $10^{4.0}$ dPa·s" refers to a value measured by a platinum sphere pull up method.

Seventh, the glass of the related invention preferably has a liquidus viscosity of $10^{4.0}$ dPa·s or more. Herein, the "liquidus viscosity" refers to a value obtained by measuring the viscosity of glass at a liquidus temperature by a platinum sphere pull up method. The "liquidus temperature" refers to a value obtained by measuring a temperature at which crystals of glass are deposited after glass powder that passed through a standard 30-mesh sieve (500 μm) and remained on a 50-mesh sieve (300 μm) is placed in a platinum boat and then the platinum boat is kept for 24 hours in a gradient heating furnace.

Eighth, the glass of the related invention is preferably used for an FPD.

Ninth, the glass of the related invention is preferably used for a PDP.

Tenth, the glass of the related invention preferably has a sheet shape.

Advantageous Effect of Invention

The glass sheet for a thin-film solar cell of the present invention has a sufficiently high strain point and has a thermal expansion coefficient matching those of peripheral members, and a photoelectric conversion film having high quality can be formed thereon.

DESCRIPTION OF EMBODIMENTS

Embodiment of the Present Invention

A glass sheet for a thin-film solar cell according to an embodiment of the present invention (hereinafter referred to as a first embodiment) is characterized by comprising, as a glass composition in terms of mass %, 45 to 60% of SiO$_2$, more than 8.0 to 18% of Al$_2$O$_3$, 0 to 15% (excluding 15%) of B$_2$O$_3$, 1 to 40% of MgO+CaO+SrO+BaO, and 1 to 30% of Na$_2$O+K$_2$O. The reasons why the content of each component was restricted as described above are shown below.

SiO$_2$ is a component that forms a network of glass. The content of SiO$_2$ is 45 to 60%, preferably 45 to 54%, more preferably 49 to 52%. When the content of SiO$_2$ is too large, the viscosity at high temperature improperly increases, the meltability and formability are liable to lower, and the thermal expansion coefficient lowers excessively, with the result that it is difficult to match the thermal expansion coefficient to those of an electrode film and photoelectric conversion film in a thin-film solar cell. Note that, in the glass composition system according to the first embodiment, even if the content of SiO$_2$ is increased, the strain point does not rise significantly. On the other hand, when the content of SiO$_2$ is too small, the denitrification resistance is liable to deteriorate. In addition, the thermal expansion coefficient increases excessively, and the thermal shock resistance of the resultant glass sheet is liable to lower, with the result that the glass sheet is liable to have a crack in a heat treatment step at the time of producing a thin-film solar cell.

Al$_2$O$_3$ is a component that increases the strain point, a component that enhances the climate resistance and chemical durability, and a component that increases the surface hardness of the resultant glass sheet. The content of Al$_2$O$_3$ is more than 8.0 to 18%, preferably more than 10.0 to 15%, more preferably more than 11.0 to 14.5%, still more preferably 11.5 to 14%. When the content of Al$_2$O$_3$ is too large, the viscosity at high temperature improperly increases, and the meltability and formability are liable to lower. On the other hand, when the content of Al$_2$O$_3$ is too small, the strain point is liable to lower. Note that, when a glass sheet has a high surface hardness, the glass sheet is liable to be damaged in the step of removing a photoelectric conversion film at the time of performing patterning to produce a CIS-based solar cell.

B$_2$O$_3$ is a component that reduces the viscosity of glass, thereby lowering the melting temperature and forming temperature, but is a component that lowers the strain point and a component that causes a furnace refractory material to wear with the volatilization of components at the time of melting glass. Thus, B$_2$O$_3$ is an optional component, and the content of B$_2$O$_3$ is 0 to less than 15%, preferably 0 to 1.5%, more preferably 0 to less than 0.1%.

MgO+CaO+SrO+BaO are components that reduce the viscosity at high temperature without lowering the strain point. When the content of MgO+CaO+SrO+BaO is too large, the denitrification resistance is liable to deteriorate and the material cost significantly increases. Further, when the content of MgO+CaO+SrO+BaO is too large, the content is liable to inhibit an alkali component, in particular, Na$_2$O from diffusing. On the other hand, when the content of MgO+CaO+SrO+BaO is too small, the viscosity at high temperature increases excessively. Thus, the content of MgO+CaO+SrO+BaO is preferably 1 to 40%, 15 to 40%, more than 17.0 to 40%, 18 to 30%, particularly preferably 19 to 25%.

MgO is a component that reduces the viscosity at high temperature to increase the meltability and formability. Further, MgO is a component that has a great effect of preventing a glass sheet from breaking easily among alkaline earth metal oxides. However, MgO is a component that remarkably reduces the liquidus viscosity when MgO coexists with ZrO$_2$, because MgO causes devitrified crystals of the ZrO$_2$ system to precipitate remarkably. Further, MgO is a component that is liable to cause devitrified crystals of the CaMgSiO system to precipitate when MgO coexists with CaO. Thus, MgO is an optional component, and the content of MgO is preferably 0 to 10%, 0 to less than 3.7%, 0.01 to 3%, 0.02 to 2%, particularly preferably 0.03 to 0.5%.

CaO is a component that reduces the viscosity at high temperature to increase the meltability and formability. Further, CaO is a component that has a great effect of preventing a glass sheet from breaking easily among alkaline earth metal oxides. The content of CaO is preferably 0 to 10%, 0.1 to 9%, more than 2.9 to 8%, 3.0 to 7.5%, particularly preferably 4.2 to 6%. When the content of CaO is too large, the denitrification resistance is liable to deteriorate and a glass sheet is difficult to be formed.

SrO is a component that reduces the viscosity at high temperature to increase the meltability and formability. Further, SrO is a component that prevents devitrified crystals of the $ZrO_2$ system from easily precipitating when SrO coexists with $ZrO_2$. The content of SrO is preferably 0 to 20%, 0.1 to 15%, more than 4.0 to 15%, 5 to 14%, more than 7.0 to 13%, particularly preferably 9.2 to 12.5%. When the content of SrO is too large, devitrified crystals of the feldspar group are liable to precipitate and the material cost significantly increases.

BaO is a component that reduces the viscosity at high temperature to increase the meltability and formability. The content of BaO is preferably 0 to 20%, 0.1 to 15%, more than 2.0 and less than 14%, more than 2.0 and less than 8%, particularly preferably more than 2.0 and less than 5%. When the content of BaO is too large, devitrified crystals of the barium feldspar group are liable to precipitate and the material cost significantly increases. In addition, the density increases and the cost of a supporting member is liable to increase significantly. Note that, when the content of BaO is too small, the viscosity at high temperature increases, and the meltability and formability tend to lower.

$Na_2O+K_2O$ are components that adjust the thermal expansion coefficient and components that reduce the viscosity at high temperature to increase the meltability and formability. Further, $Na_2O+K_2O$ are components that are effective for the growth of a chalcopyrite crystal in a CIS-based solar cell and components that are important for enhancing the photoelectric conversion efficiency thereof. The content of $Na_2O+K_2O$ is preferably 1 to 30%, 2 to 20%, 4 to 18%, more than 4.3 to 15%, particularly preferably 7 to 12%. When the content of $Na_2O+K_2O$ is too large, the strain point is liable to lower, the thermal expansion coefficient increases excessively, and the thermal shock resistance of the resultant glass sheet is liable to lower. As a result, the glass sheet is liable to have thermal shrinkage and thermal deformation, and to have a crack in a heat treatment step at the time of producing a thin-film solar cell. On the other hand, when the content of $Na_2O+K_2O$ is too small, the above-mentioned effects are difficult to be provided.

$Na_2O$ is a component that adjusts the thermal expansion coefficient and a component that reduces the viscosity at high temperature to increase the meltability and formability. Further, $Na_2O$ is a component that is effective for the growth of a chalcopyrite crystal in a CIS-based solar cell and a component that is important for enhancing the photoelectric conversion efficiency thereof. The content of $Na_2O$ is preferably 0 to 20%, 0.1 to 15%, 4 to 12%, particularly preferably more than 4.3 to 9%. When the content of $Na_2O$ is too large, the strain point is liable to lower, the thermal expansion coefficient increases excessively, and the thermal shock resistance of the resultant glass sheet is liable to lower. As a result, the glass sheet is liable to have thermal shrinkage and thermal deformation, and to have a crack in a heat treatment step at the time of producing a thin-film solar cell.

$K_2O$ is a component that adjusts the thermal expansion coefficient and a component that reduces the viscosity at high temperature to increase the meltability and formability. Further, $K_2O$ is a component that is effective for the growth of a chalcopyrite crystal in a CIS-based solar cell and a component that is important for enhancing the photoelectric conversion efficiency thereof. However, when the content of $K_2O$ is too large in a glass system comprising $Al_2O_3$ at more than 10%, devitrified crystals of the KAlSiO system are liable to precipitate. Further, when the content of $K_2O$ is too large, the strain point is liable to lower, the thermal expansion coefficient increases excessively, and the thermal shock resistance of the resultant glass sheet is liable to lower. As a result, the glass sheet is liable to have thermal shrinkage and thermal deformation, and to have a crack in a heat treatment step at the time of producing a thin-film solar cell. Thus, the content of $K_2O$ is preferably 0 to 15%, 0.1 to 10%, particularly preferably 1 to 7%.

In addition, the glass sheet for a thin-film solar cell according to the first embodiment preferably has the following component contents and component ratios.

$Li_2O$ is a component that adjusts the thermal expansion coefficient and a component that reduces the viscosity at high temperature to increase the meltability and formability. Further, $Li_2O$ is a component that is effective for the growth of a chalcopyrite crystal in a CIS-based solar cell as in $Na_2O$ or $K_2O$. However, $Li_2O$ is a component whose material cost is high and which significantly lowers the strain point. Thus, $Li_2O$ is an optional component and the content thereof is preferably 0 to 10%, 0 to 2%, particularly preferably 0 to less than 0.1%.

$ZrO_2$ is a component that increases the strain point without increasing the viscosity at high temperature. However, when the content of $ZrO_2$ is too large, the density is liable to increase and the resultant glass sheet is liable to break. Besides, devitrified crystals of the $ZrO_2$ system are liable to precipitate and a glass sheet is difficult to be formed. Thus, $ZrO_2$ is an optional component and the content thereof is preferably 0 to 15%, 0 to 10%, 0 to 7%, 0.1 to 6.5%, particularly preferably 2 to 6%.

Fe is present in the state of $Fe^{2+}$ or $Fe^{3+}$ in glass, and $Fe^{2+}$ has particularly strong light absorption properties in the near-infrared region. Thus, $Fe^{2+}$ is likely to absorb radiation energy in a glass melting furnace with a large capacity and has the effect of enhancing melting efficiency. Further, $Fe^{3+}$ releases oxygen when the valence of iron changes, thus having a fining effect. Besides, in order to reduce the production cost of a glass sheet, it is preferred to restrict the use of a high-purity material (material having an extremely low content of $Fe_2O_3$) and use a material containing $Fe_2O_3$ at a small ratio. On the other hand, when the content of $Fe_2O_3$ is too large, glass is liable to absorb solar light, and hence the surface temperature of the resultant thin-film solar cell easily rises, with the result that the photoelectric conversion efficiency thereof may deteriorate. Further, when the content of $Fe_2O_3$ is too large, radiation energy in the furnace is absorbed near the energy source and does not reach the central portion of the furnace, with the result that the thermal distribution in the glass melting furnace is liable to be uneven. Thus, the content of $Fe_2O_3$ is preferably 0 to 1%, particularly preferably 0.01 to 1%. Further, the lower limit of $Fe_2O_3$ is suitably 0.05%, 0.10%, particularly suitably 0.20%. Note that, regardless of the valence of Fe, the content of iron oxide is expressed on the basis of a value obtained by conversion to "$Fe_2O_3$."

$TiO_2$ is a component that prevents coloring by ultraviolet light and enhances the climate resistance. However, when the content of $TiO_2$ is too large, glass is liable to denitrify and to be colored into a brownish-red color. Thus, the content of $TiO_2$ is preferably 0 to 10%, particularly preferably 0 to less than 0.1%.

$P_2O_5$ is a component that enhances the devitrification resistance, a component that particularly suppresses the precipitation of devitrified crystals of the $ZrO_2$ system, and a component that prevents a glass sheet from easily breaking. However, when the content of $P_2O_5$ is too large, glass is liable to have phase separation in an opaque white color. Thus, the content of $P_2O_5$ is preferably 0 to 10%, 0 to 0.2%, particularly preferably 0 to less than 0.1%.

ZnO is a component that reduces the viscosity at high temperature. When the content of ZnO is too large, the devitrification resistance is liable to deteriorate. Thus, the content of ZnO is preferably 0 to 10%, particularly preferably 0 to 5%.

$SO_3$ is a component that acts as a fining agent, and the content thereof is preferably 0 to 1%, particularly preferably 0.01 to 1%. Note that, when glass sheets are formed by a float method, the glass sheets can be produced in a large quantity at low cost, but in this case, it is preferred to use sodium sulfate decahydrate as a fining agent.

$Sb_2O_3$ is a component that acts as a fining agent, but is a component that colors glass when a glass sheet is formed by a float method and a component that may give a load to the environment. The content of $Sb_2O_3$ is preferably 0 to 1%, particularly preferably 0 to less than 0.1%.

$As_2O_3$ is a component that acts as a fining agent, but is a component that colors glass when a glass sheet is formed by a float method and a component that may give a load to the environment. The content of $As_2O_3$ is preferably 0 to 1%, particularly preferably 0 to less than 0.1%.

$SnO_2$ is a component that acts as a fining agent but a component that deteriorates the devitrification resistance. The content of $SnO_2$ is preferably 0 to 1%, particularly preferably 0 to less than 0.1%.

$SiO_2$—$Al_2O_3$ refers to a difference in content between $SiO_2$, which is a main constituent component, and $Al_2O_3$, which highly contributes to increasing the strain point, both being components constituting a network of glass. When $SiO_2$—$Al_2O_3$ is too large, the strain point is liable to lower. On the other hand, when $SiO_2$—$Al_2O_3$ is too small, the devitrification resistance is liable to deteriorate. Thus, the content of $SiO_2$—$Al_2O_3$ is preferably 28 to 50%, 30 to less than 45%, 32 to 43%, particularly preferably 34 to 40%.

MgO+CaO refers to the sum of two components that highly reduce the viscosity at high temperature among the alkaline earth metal oxides, thereby increasing the moving speeds of the upward flow, downward flow, and backward flow toward the batch slot direction in a glass melting furnace, and homogenizing glass. Further, MgO+CaO refers to the sum of two components that are most capable of maintaining the resistance to the breakage of a glass sheet, and are most capable of decreasing the density, among the alkaline earth metal oxides. When the density decreases, the cost of a supporting member in a thin-film solar cell can be reduced. The content of MgO+CaO is preferably 0 to 10%, 0.1 to 10%, more than 2.9 to 10%, particularly preferably more than 3.4 to less than 9.4%. When the content of MgO+CaO is too large, the devitrification resistance is liable to deteriorate and in particular, devitrified crystals of the $ZrO_2$ system are liable to precipitate. Note that, when the content of MgO+CaO is too small, the moving speed of a glass melt decreases in a glass melting furnace, preventing the homogenization of the glass melt, with the result that the meltability and formability tend to lower.

The mass ratio CaO/MgO refers to the ratio of CaO to MgO, both having greater effects of reducing the viscosity at high temperature among the alkaline earth metal oxides. From the viewpoint of devitrification resistance, the mass ratio CaO/MgO refers to the ratio of CaO, which is more unlikely to produce the devitrified crystal of the $ZrO_2$ system in comparison to MgO, to MgO, which is particularly likely to produce the devitrified crystal of the $ZrO_2$ system. The mass ratio CaO/MgO is preferably more than 1, more than 2, more than 2.5, particularly preferably more than 3.4, in order to reduce the viscosity at high temperature while suppressing the precipitation of the devitrified crystal of the $ZrO_2$ system.

The content of CaO+SrO is preferably 0 to 30%, 0.1 to 25%, 6.92 to 23%, 8 to 21%, particularly preferably 9 to 20%. When the content of CaO+SrO is too large, the denitrification resistance is liable to deteriorate. Note that, when the content of CaO+SrO is too small, the moving speed of a glass melt decreases in a glass melting furnace, preventing the homogenization of the glass melt, with the result that the meltability and formability tend to lower.

The mass ratio $Na_2O/(MgO+CaO+SrO+BaO+Li_2O+Na_2O+K_2O)$ refers to the ratio of the content of $Na_2O$, which is useful for the precipitation of a chalcopyrite crystal in a CIS-based solar cell, to the total content (total content of MgO, CaO, SrO, BaO, $Li_2O$, $Na_2O$, and $K_2O$) of the components which have great effects of reducing the viscosity at high temperature. The mass ratio $Na_2O/(MgO+CaO+SrO+BaO+Li_2O+Na_2O+K_2O)$ is preferably 0.005 to 0.5, 0.05 to 0.4, 0.1 to 0.38, 0.137 to 0.355, 0.140 to 0.300, particularly preferably more than 0.158 to 0.250. When the mass ratio $Na_2O/(MgO+CaO+SrO+BaO+Li_2O+Na_2O+K_2O)$ is too large, a high strain point is difficult to be maintained, and the meltability and formability are liable to lower. On the other hand, when the mass ratio $Na_2O/(MgO+CaO+SrO+BaO+Li_2O+Na_2O+K_2O)$ is too small, the photoelectric conversion efficiency of the resultant thin-film solar cell is liable to deteriorate. Further, when the mass ratio $Na_2O/(MgO+CaO+SrO+BaO+Li_2O+Na_2O+K_2O)$ is too small, there is no other way but to increase the content of $Li_2O$ or $K_2O$ in order to reduce the viscosity at high temperature, with the result that the material cost significantly increases. Note that, when the content of $K_2O$ is preferentially increased, devitrified crystals of the KAlSiO system are liable to precipitate in a glass system comprising $Al_2O_3$ at more than 10%. Besides, even when the mass ratio $Na_2O/(MgO+CaO+SrO+BaO+Li_2O+Na_2O+K_2O)$ is too small, a high strain point is difficult to be maintained, the denitrification resistance deteriorates, and the liquidus viscosity is liable to lower.

In addition to the above-mentioned components, each of F, Cl, and $CeO_2$ may be added up to 1% in total in order to enhance the meltability, fining property, and formability. Moreover, each of $Nb_2O_5$, $HfO_2$, $Ta_2O_5$, $Y_2O_3$, and $La_2O_3$ may be added up to 3% in order to enhance the chemical durability. Further, rare-earth oxides and transition metal oxides except the above-mentioned oxides may be added up to 2% in total in order to adjust the color tone.

The glass sheet for a thin-film solar cell according to the first embodiment has a thermal expansion coefficient of preferably 70 to $100 \times 10^7$/° C., particularly preferably 80 to $90 \times 10^{-7}$/° C. As a result, the thermal expansion coefficient easily matches those of an electrode film and photoelectric conversion film in a thin-film solar cell. Note that, when the thermal expansion coefficient of a glass sheet is too high, the thermal shock resistance of the glass sheet is liable to lower, with the result that the glass sheet is liable to have a crack in a heat treatment step at the time of producing a thin-film solar cell.

The glass sheet for a thin-film solar cell according to the first embodiment has a density of preferably 2.90 g/cm$^3$ or less, particularly preferably 2.85 g/cm$^3$ or less. As a result, the cost of a supporting member in a thin-film solar cell can be easily reduced. Note that the "density" can be measured by a well-known Archimedes method.

The glass sheet for a thin-film solar cell according to the first embodiment has a strain point of more than 580° C., preferably more than 600 to 650° C., more preferably more than 605 to 650° C., still more preferably more than 610 to 650° C. As a result, the glass sheet is difficult to have thermal shrinkage and thermal deformation in a heat treatment step at the time of producing a thin-film solar cell.

The glass sheet for a thin-film solar cell according to the first embodiment has a temperature at $10^{4.0}$ dPa·s of preferably 1,200° C. or less, particularly preferably 1,180° C. or less. As a result, the glass sheet is easily formed at low temperature.

The glass sheet for a thin-film solar cell according to the first embodiment has a temperature at $10^{2.5}$ dPa·s of preferably 1,520° C. or less, particularly preferably 1,460° C. or less. As a result, a glass material thereof is easily melted at low temperature. Note that the "temperature at $10^{2.5}$ dPa·s" can be measured by a platinum sphere pull up method.

The glass sheet for a thin-film solar cell according to the first embodiment has a liquidus temperature of preferably 1,160° C. or less, particularly preferably 1,100° C. or less. As the liquidus temperature of glass increases, the glass is liable to devitrify at the time of the forming thereof and the formability is liable to lower.

The glass sheet for a thin-film solar cell according to the first embodiment has a liquidus viscosity of preferably $10^{4.0}$ dPa·s or more, particularly preferably $10^{4.3}$ dPa·s or more. As the liquidus viscosity of glass decreases, the glass is liable to devitrify at the time of the forming thereof and the formability is liable to lower.

The glass sheet for a thin-film solar cell according to the first embodiment has a Young's modulus of preferably 78 GPa or more, particularly preferably 80 GPa or more, and has a specific Young's modulus of preferably 27.5 GPa/(g/cm$^3$) or more, particularly preferably 28 GPa/(g/cm$^3$) or more. As a result, the glass sheet is difficult to bend, and hence, when the glass sheet is handled in a transportation step or a packing step, it is unlikely that the glass sheet significantly swings to drop or the glass sheet comes into contact with another member to be damaged. Herein, the "Young's modulus" refers to a value obtained through measurement by a resonance method. The "specific Young's modulus" refers to a value obtained by dividing the Young's modulus by the density.

The glass sheet for a thin-film solar cell according to the first embodiment can be manufactured by loading a glass material, which is prepared so as to have a glass composition in the above-mentioned glass composition range, into a continuous melting furnace, heating and melting the glass material, then removing bubbles from the resultant glass melt, feeding the glass melt into a forming apparatus, and forming the glass melt into a sheet shape, followed by annealing.

It is possible to exemplify, as a method of forming a glass sheet, a float method, a slot down-draw method, an overflow down-draw method, and a redraw method. When inexpensive glass sheets are produced in a large quantity, a float method is preferably adopted.

The glass sheet for a thin-film solar cell according to the first embodiment preferably does not undergo chemical tempering treatment, in particular, ion exchange treatment. A heat treatment step with high temperature is required to produce a thin-film solar cell. In the heat treatment step with high temperature, a tempered layer (compression stress layer) disappears, and hence performing chemical tempering treatment only provides a few benefits. Further, because of the same reason as above, physical tempering treatment such as air cooling tempering preferably is not performed as well.

Particularly when a CIS-based solar cell is produced, ion exchange treatment applied to a glass sheet decreases the number of Na ions in the surfaces thereof, and hence the photoelectric conversion efficiency is liable to deteriorate. In this case, it is preferred to adopt separately a method of forming an Na supply film on a glass sheet.

Embodiment of Related Invention

Glass according to an embodiment of a related invention (the embodiment hereinafter being referred to as a second embodiment) is characterized by comprising, as a glass composition expressed in mass % in terms of the following oxides, 45 to 55% (excluding 55%) of $SiO_2$, more than 10.0 to 15% of $Al_2O_3$, 0 to 15% of $B_2O_3$, 0 to 3.7% (excluding 3.7%) of MgO, more than 2.9 to 8% of CaO, more than 4.0 to 15% of SrO, more than 2.0 to 14% (excluding 14.0%) of BaO, 0 to 10% of $Li_2O$, more than 4.0 to 15% of $Na_2O$, 0 to 10% of $K_2O$, 0 to 7% of $ZrO_2$, and 0.01 to 1% of $Fe_2O_3$. The reasons why the content of each component was restricted as described above are shown below.

$SiO_2$ is a component that forms a network of glass. The content of $SiO_2$ is 45 to less than 55%, preferably 49 to 52%. When the content of $SiO_2$ is too large, the viscosity at high temperature improperly increases, the meltability and formability are liable to lower, and the thermal expansion coefficient lowers excessively. As a result, it is difficult to match the thermal expansion coefficient to those of peripheral members such as a seal frit. Note that, in the glass composition system according to the related invention, even if the content of $SiO_2$ is increased, the strain point does not rise significantly. On the other hand, when the content of $SiO_2$ is too small, the denitrification resistance is liable to deteriorate. In addition, the thermal expansion coefficient increases excessively, and the thermal shock resistance of the resultant glass sheet is liable to lower, with the result that the glass sheet is liable to have a crack in a heat treatment step at the time of producing a PDP or the like.

$Al_2O_3$ is a component that increases the strain point, a component that enhances the climate resistance and chemical durability, and a component that increases the surface hardness of the resultant glass. The content of $Al_2O_3$ is more than 10.0 to 15%, preferably more than 11.0 to 14.5%, more preferably 11.5 to 14%. When the content of $Al_2O_3$ is too large, the viscosity at high temperature improperly increases, and the meltability and formability are liable to lower. On the other hand, when the content of $Al_2O_3$ is too small, the strain point is liable to lower.

$B_2O_3$ is a component that reduces the viscosity of glass, thereby lowering the melting temperature and forming temperature, but is a component that lowers the strain point and a component that causes a furnace refractory material to wear with the volatilization of components at the time of melting glass. Thus, $B_2O_3$ is an optional component, and the content of $B_2O_3$ is 0 to 15%, preferably 0 to 1.5%, more preferably 0 to less than 0.1%.

MgO is a component that reduces the viscosity at high temperature to increase the meltability and formability. Further, MgO is a component that has a great effect of preventing glass from breaking easily among alkaline earth metal oxides. However, MgO is a component that remarkably reduces the liquidus viscosity when MgO coexists with $ZrO_2$, because MgO causes devitrified crystals of the $ZrO_2$ system to precipitate remarkably. Further, MgO is a component that is liable to cause devitrified crystals of the CaMgSiO system to precipitate when MgO coexists with CaO. Thus, MgO is an optional component, and the content of MgO is preferably 0 to less than 3.7%, preferably 0.01 to 3%, more preferably 0.02 to 2%, still more preferably 0.03 to 0.5%.

CaO is a component that reduces the viscosity at high temperature to increase the meltability and formability. Further, CaO is a component that has a great effect of preventing glass from breaking easily among alkaline earth metal oxides. The content of CaO is more than 2.9 to 8%, preferably 3 to 7.5%, more preferably 4.2 to 6%. When the content of CaO is too large, the denitrification resistance is liable to deteriorate and a glass sheet is difficult to be formed. On the other hand, when the content of CaO is too small, the above-mentioned effects are difficult to be provided.

SrO is a component that reduces the viscosity at high temperature to increase the meltability and formability. Further, SrO is a component that prevents devitrified crystals of the $ZrO_2$ system from easily precipitating when SrO coexists with $ZrO_2$. The content of SrO is more than 4.0 to 15%, preferably 5 to 14%, more preferably more than 7.0 to 13%, still more preferably 9.2 to 12.5%. When the content of SrO is too large, devitrified crystals of the feldspar group are liable to precipitate and the material cost significantly increases. On the other hand, when the content of SrO is too small, the above-mentioned effects are difficult to be provided.

BaO is a component that reduces the viscosity at high temperature to increase the meltability and formability. The content of BaO is more than 2.0 and less than 14%, preferably more than 2.0 and less than 8%, more preferably more than 2.0 and less than 5%. When the content of BaO is too large, devitrified crystals of the barium feldspar group are liable to precipitate and the material cost significantly increases. In addition, the density increases and the cost of a supporting member is liable to increase significantly. On the other hand, when the content of BaO is too small, the viscosity at high temperature improperly increases, and the meltability and formability are liable to lower.

$Li_2O$ is a component that adjusts the thermal expansion coefficient and a component that reduces the viscosity at high temperature to increase the meltability and formability. However, $Li_2O$ is a component whose material cost is high and which significantly lowers the strain point. Thus, $Li_2O$ is an optional component and the content thereof is 0 to 10%, preferably 0 to 2%, more preferably 0 to less than 0.1%.

$Na_2O$ is a component that adjusts the thermal expansion coefficient and a component that reduces the viscosity at high temperature to increase the meltability and formability. The content of $Na_2O$ is 4 to 15%, preferably more than 4.3 to 12%, more preferably 4.5 to 9%, most preferably 5 to 7%. When the content of $Na_2O$ is too large, the strain point is liable to lower, the thermal expansion coefficient increases excessively, and the thermal shock resistance of the resultant glass sheet is liable to lower. As a result, the glass sheet is liable to have thermal shrinkage and thermal deformation, and to have a crack in a heat treatment step at the time of producing a PDP or the like.

$K_2O$ is a component that adjusts the thermal expansion coefficient and a component that reduces the viscosity at high temperature to increase the meltability and formability. However, when the content of $K_2O$ is too large in a glass system comprising $Al_2O_3$ at more than 10%, devitrified crystals of the KAlSiO system are liable to precipitate. Further, when the content of $K_2O$ is too large, the strain point is liable to lower, the thermal expansion coefficient increases excessively, and the thermal shock resistance of the resultant glass sheet is liable to lower. As a result, the glass sheet is liable to have thermal shrinkage and thermal deformation, and to have a crack in a heat treatment step at the time of producing a PDP or the like. Thus, $K_2O$ is an optional component and the content of $K_2O$ is 0 to 10%, preferably 0.1 to 7%.

$ZrO_2$ is a component that increases the strain point without increasing the viscosity at high temperature. However, when the content of $ZrO_2$ is too large, the density is liable to increase and the resultant glass is liable to break. Besides, devitrified crystals of the $ZrO_2$ system are liable to precipitate and a glass sheet is difficult to be formed. Thus, $ZrO_2$ is an optional component and the content thereof is 0 to 7%, preferably 0.1 to 6.5%, more preferably 2 to 6%.

Fe is present in the state of $Fe^{2+}$ or $Fe^{3+}$ in glass, and $Fe^{2+}$ has particularly strong light absorption properties in the near-infrared region. Thus, $Fe^{2+}$ is likely to absorb radiation energy in a glass melting furnace with a large capacity and has the effect of enhancing melting efficiency. Further, $Fe^{3+}$ releases oxygen when the valence of iron changes, thus having a fining effect. Besides, in order to reduce the production cost of glass, it is preferred to restrict the use of a high-purity material (material having an extremely low content of $Fe_2O_3$) and use a material containing $Fe_2O_3$ at a small ratio. On the other hand, when the content of $Fe_2O_3$ is too large, radiation energy in the furnace is absorbed near the energy source and does not reach the central portion of the furnace, with the result that the thermal distribution in the glass melting furnace is liable to be uneven. Thus, the content of $Fe_2O_3$ is 0.01 to 1%. Further, the lower limit of $Fe_2O_3$ is suitably 0.05%, 0.10%, particularly suitably 0.20%. Note that, regardless of the valence of Fe, the content of iron oxide is expressed on the basis of a value obtained by conversion to "$Fe_2O_3$."

In addition, the glass according to the second embodiment preferably has the following component contents and component ratios.

$SiO_2$—$Al_2O_3$ refers to a difference in content between $SiO_2$, which is a main constituent component, and $Al_2O_3$, which highly contributes to increasing the strain point, both being components constituting a network of glass. When $SiO_2$—$Al_2O_3$ is too large, the strain point is liable to lower. On the other hand, when $SiO_2$—$Al_2O_3$ is too small, the devitrification resistance is liable to deteriorate. Thus, the content of $SiO_2$—$Al_2O_3$ is preferably 30 to less than 45%, 32 to 43%, particularly preferably 34 to 40%.

MgO+CaO+SrO+BaO are components that reduce the viscosity at high temperature without lowering the strain point. When the content of MgO+CaO+SrO+BaO is too large, the devitrification resistance is liable to deteriorate and the material cost significantly increases. On the other hand, when the content of MgO+CaO+SrO+BaO is too small, the viscosity at high temperature increases excessively. Thus, the content of MgO+CaO+SrO+BaO is preferably more than 17.0 to 40%, 18 to 30%, particularly preferably 19 to 25%.

MgO+CaO refers to the sum of two components that highly reduce the viscosity at high temperature among the alkaline earth metal oxides, thereby increasing the moving speeds of the upward flow, downward flow, and backward flow toward the batch slot direction in a glass melting furnace, and homogenizing glass. Further, MgO+CaO refers to the sum of two components that are most capable of maintaining the resistance to the breakage of glass, and are most capable of decreasing the density, among the alkaline earth metal oxides. When the density decreases, the cost of a supporting member in a PDP or the like can be reduced. The content of MgO+CaO is preferably more than 2.9 to 10%, particularly preferably more than 3.4 to less than 9.4%. When the content of MgO+CaO is too large, the devitrification resistance is liable to deteriorate and in particular, devitrified crystals of the $ZrO_2$ system are liable to precipitate. On the other hand, when the content of MgO+CaO is too small, the moving speed of a glass melt decreases in a glass melting furnace, preventing the homogenization of the glass melt, with the result that the meltability and formability are liable to lower.

The mass ratio CaO/MgO refers to the ratio of CaO to MgO, both having greater effects of reducing the viscosity at high temperature among the alkaline earth metal oxides. From the viewpoint of devitrification resistance, the mass ratio CaO/MgO refers to the ratio of CaO, which is more unlikely to produce the devitrified crystal of the $ZrO_2$ system in comparison to MgO, to MgO, which is particularly likely to produce the devitrified crystal of the $ZrO_2$ system. The mass ratio CaO/MgO is preferably more than 1, more than 2, more than 2.5, particularly preferably more than 3.4, in order to reduce the viscosity at high temperature while suppressing the precipitation of the devitrified crystal of the $ZrO_2$ system.

The content of CaO+SrO is preferably 6.92 to 23%, 8 to 21%, particularly preferably 9 to 20%. When the content of CaO+SrO is too large, the denitrification resistance is liable to deteriorate. On the other hand, when the content of CaO+SrO is too small, the moving speed of a glass melt excessively decreases in a glass melting furnace, preventing the homogenization of the glass melt, with the result that the meltability and formability are liable to lower.

The mass ratio $Na_2O/(MgO+CaO+SrO+BaO+Li_2O+Na_2O+K_2O)$ refers to the ratio of the content of $Na_2O$ to the total content (total content of MgO, CaO, SrO, BaO, $Li_2O$, $Na_2O$, and $K_2O$) of the components which have great effects of reducing the viscosity at high temperature. The mass ratio $Na_2O/(MgO+CaO+SrO+BaO+Li_2O+Na_2O+K_2O)$ is preferably 0.137 to 0.355, 0.140 to 0.300, particularly preferably more than 0.158 to 0.250. When the mass ratio $Na_2O/(MgO+CaO+SrO+BaO+Li_2O+Na_2O+K_2O)$ is too large, a high strain point is difficult to be maintained, and the meltability and formability are liable to lower. On the other hand, when the mass ratio $Na_2O/(MgO+CaO+SrO+BaO+Li_2O+Na_2O+K_2O)$ is too small, there is no other way but to increase the content of $Li_2O$ or $K_2O$ in order to reduce the viscosity at high temperature, with the result that the material cost significantly increases. Note that, when the content of $K_2O$ is preferentially increased, devitrified crystals of the KAlSiO system are liable to precipitate in a glass system comprising $Al_2O_3$ at more than 10%. On the other hand, even when the mass ratio $Na_2O/(MgO+CaO+SrO+BaO+Li_2O+Na_2O+K_2O)$ is too small, a high strain point is difficult to be maintained, the devitrification resistance deteriorates, and the liquidus viscosity is liable to lower.

In addition to the above-mentioned components, for example, the following components may be added.

$TiO_2$ is a component that prevents coloring by ultraviolet light and enhances the climate resistance. However, when the content of $TiO_2$ is too large, glass is liable to denitrify and to be colored into a brownish-red color. Thus, the content of $TiO_2$ is preferably 0 to 10%, particularly preferably 0 to less than 0.1%.

$P_2O_5$ is a component that enhances the devitrification resistance, a component that particularly suppresses the precipitation of devitrified crystals of the $ZrO_2$ system, and a component that prevents glass from easily breaking. However, when the content of $P_2O_5$ is too large, glass is liable to have phase separation in an opaque white color. Thus, the content of $P_2O_5$ is preferably 0 to 10%, 0 to 0.2%, particularly preferably 0 to less than 0.1%.

ZnO is a component that reduces the viscosity at high temperature. When the content of ZnO is too large, the devitrification resistance is liable to deteriorate. Thus, the content of ZnO is preferably 0 to 10%, particularly preferably 0 to 5%.

$SO_3$ is a component that acts as a fining agent, and the content thereof is preferably 0 to 1%, particularly preferably 0.01 to 1%. Note that, when glass sheets are formed by a float method, the glass sheets can be produced in a large quantity at low cost, but in this case, it is preferred to use sodium sulfate decahydrate as a fining agent.

$Sb_2O_3$ is a component that acts as a fining agent, but is a component that colors glass when a glass sheet is formed by a float method and a component that may give a load to the environment. The content of $Sb_2O_3$ is preferably 0 to 1%, particularly preferably 0 to less than 0.1%.

$As_2O_3$ is a component that acts as a fining agent, but is a component that colors glass when a glass sheet is formed by a float method and a component that may give a load to the environment. The content of $As_2O_3$ is preferably 0 to 1%, particularly preferably 0 to less than 0.1%.

$SnO_2$ is a component that acts as a fining agent but a component that deteriorates the denitrification resistance. The content of $SnO_2$ is preferably 0 to 1%, particularly preferably 0 to less than 0.1%.

In addition to the above-mentioned components, each of F, Cl, and $CeO_2$ may be added up to 1% in total in order to enhance the meltability, fining property, and formability. Moreover, each of $Nb_2O_5$, $HfO_2$, $Ta_2O_5$, $Y_2O_3$, and $La_2O_3$ may be added up to 3% in order to enhance the chemical durability. Further, rare-earth oxides and transition metal oxides except the above-mentioned oxides may be added up to 2% in total in order to adjust the color tone.

The glass according to the second embodiment has a thermal expansion coefficient of preferably $70\times10^{-7}$ to $100\times10^{-7}/°C.$, particularly preferably $80\times10^{-7}$ to $90\times10^{-7}/°C$. As a result, the thermal expansion coefficient easily matches those of peripheral members such as a seal frit. Note that, when the thermal expansion coefficient is too high, the thermal shock resistance of the resultant glass sheet is liable to lower, with the result that the glass sheet is liable to have a crack in a heat treatment step at the time of producing a PDP or the like.

The glass according to the second embodiment has a density of preferably 2.90 $g/cm^3$ or less, particularly preferably 2.85 $g/cm^3$ or less. As a result, the cost of a supporting member in a PDP or the like can be easily reduced. Note that the "density" can be measured by a well-known Archimedes method.

The glass according to the second embodiment has a strain point of preferably more than 600 to 650° C., more than 605 to 650° C., particularly preferably more than 610 to 650° C. As a result, a glass sheet is difficult to have thermal shrinkage and thermal deformation in a heat treatment step at the time of producing a PDP or the like.

The glass according to the second embodiment has a temperature at $10^{4.0}$ dPa·s of preferably 1,200° C. or less, particularly preferably 1,180° C. or less. As a result, a glass sheet is easily formed at low temperature.

The glass according to the second embodiment has a temperature at $10^{2.5}$ dPa·s of preferably 1,520° C. or less, particularly preferably 1,460° C. or less. As a result, a glass material thereof is easily melted at low temperature. Note that the "temperature at $10^{2.5}$ dPa·s" can be measured by a platinum sphere pull up method.

The glass according to the second embodiment has a liquidus temperature of preferably 1,160° C. or less, particularly preferably 1,100° C. or less. As the liquidus temperature of the glass increases, the glass is liable to devitrify at the time of the forming thereof and the formability is liable to lower.

The glass according to the second embodiment has a liquidus viscosity of preferably $10^{4.0}$ dPa·s or more, particularly preferably $10^{4.3}$ dPa·s or more. As the liquidus viscosity of the glass decreases, the glass is liable to devitrify at the time of the forming thereof and the formability is liable to lower.

The glass according to the second embodiment has a dielectric constant of preferably 8 or less, 7.9 or less, particularly preferably 7.8 or less. As a result, the amount of an electric current necessary for causing a cell to emit light once decreases, and hence the power consumption of a PDP or the like is likely to be reduced. Herein, the "dielectric constant"

refers to a value obtained through measurement under the conditions of 25° C. and 1 MHz on the basis of ASTM D150-87.

The glass according to the second embodiment has a volume electric resistivity (150° C.) of preferably 11.0 or more, particularly preferably 11.5 or more. As a result, the alkali components in the glass are difficult to move, and hence the alkali components are difficult to react with an electrode such as an ITO film, and consequently, the electric resistance of the electrode is difficult to change. Herein, the "volume electric resistivity (150° C.)" refers to a value obtained through measurement at 150° C. on the basis of ASTM C657-78.

The glass according to the second embodiment has a dielectric dissipation factor of preferably 0.05 or less, 0.01 or less, particularly preferably 0.005 or less. When the glass has a higher dielectric dissipation factor, the application of a voltage to a pixel electrode or the like causes the glass to generate heat, with the result that the operating characteristics of a PDP or the like may be adversely affected. Herein, the "dielectric dissipation factor" refers to a value obtained through measurement under the conditions of 25° C. and 1 MHz on the basis of ASTM D150-87.

The glass according to the second embodiment has a Young's modulus of preferably 78 GPa or more, particularly preferably 80 GPa or more, and has a specific Young's modulus of preferably 27.5 GPa/(g/cm$^3$) or more, particularly preferably 28 GPa/(g/cm$^3$) or more. As a result, a glass sheet is difficult to bend, and hence, when the glass sheet is handled in a transportation step or a packing step, it is unlikely that the glass sheet significantly swings to drop or the glass sheet comes into contact with another member to be damaged.

Herein, the "Young's modulus" refers to a value obtained through measurement by a resonance method. The "specific Young's modulus" refers to a value obtained by dividing the Young's modulus by the density.

The glass according to the second embodiment can be manufactured by loading a glass material, which is prepared so as to have a glass composition in the above-mentioned glass composition range, into a continuous melting furnace, heating and melting the glass material, then removing bubbles from the resultant glass melt, feeding the glass melt into a forming apparatus, and forming the glass melt into a sheet shape or the like, followed by annealing.

It is possible to exemplify, as a method of forming a glass sheet, a float method, a slot down-draw method, an overflow down-draw method, and a redraw method. When inexpensive glass sheets are produced in a large quantity, a float method is preferably adopted.

Note that the glass of the related invention can also be applied to a silicon solar cell and a dye-sensitized solar cell in addition to FPD's such as a PDP and a field emission display.

Example 1

Examples of the Present Invention

Examples of the present invention are described below. Note that the following examples are merely for illustrative purposes. The present invention is by no means limited to the following examples.

Tables 1 to 6 show Examples of the present invention (Sample Nos. 1 to 35 and 39 to 45) and Comparative Examples (Sample Nos. 36 to 38).

TABLE 1

|  |  | Example | | | | | | | |
|---|---|---|---|---|---|---|---|---|---|
|  |  | No. 1 | No. 2 | No. 3 | No. 4 | No. 5 | No. 6 | No. 7 | No. 8 |
| Glass composition (wt %) | $SiO_2$ | 51.0 | 51.0 | 51.0 | 52.0 | 53.0 | 53.0 | 53.5 | 51.0 |
|  | $Al_2O$ | 13.0 | 13.0 | 13.0 | 13.0 | 13.0 | 13.0 | 12.4 | 13.0 |
|  | MgO | 0.1 | 0.1 | 0.1 | 0.1 | 0.1 | 0.1 | 0.1 | 0.1 |
|  | CaO | 7.1 | 5.4 | 5.4 | 5.4 | 5.4 | 5.4 | 5.1 | 5.4 |
|  | SrO | 11.9 | 13.6 | 11.9 | 9.1 | 9.1 | 9.1 | 11.2 | 11.9 |
|  | BaO | 3.5 | 3.5 | 5.2 | 6.3 | 6.3 | 6.7 | 3.3 | 3.5 |
|  | $Na_2O$ | 4.3 | 4.3 | 4.3 | 4.3 | 4.3 | 4.3 | 5.7 | 6.0 |
|  | $K_2O$ | 4.3 | 4.3 | 4.3 | 6.0 | 6.0 | 5.6 | 4.1 | 4.3 |
|  | $ZrO_2$ | 4.6 | 4.6 | 4.6 | 3.6 | 2.6 | 2.6 | 4.4 | 4.6 |
|  | $Fe_2O$ | 0.10 | 0.10 | 0.10 | 0.10 | 0.10 | 0.10 | 0.10 | 0.10 |
|  | $SO_3$ | 0.10 | 0.10 | 0.10 | 0.10 | 0.10 | 0.10 | 0.10 | 0.10 |
| Si – Al |  | 38.0 | 38.0 | 38.0 | 39.0 | 40.0 | 40.0 | 41.1 | 38.0 |
| Na + K |  | 8.6 | 8.6 | 8.6 | 10.3 | 10.3 | 9.9 | 9.8 | 10.3 |
| Mg + Ca + Sr + Ba |  | 22.6 | 22.6 | 22.6 | 20.9 | 20.9 | 21.3 | 19.7 | 20.9 |
| Mg + Ca |  | 7.2 | 5.5 | 5.5 | 5.5 | 5.5 | 5.5 | 5.2 | 5.5 |
| Ca/Mg |  | 71.0 | 54.0 | 54.0 | 54.0 | 54.0 | 54.0 | 51.0 | 54.0 |
| Ca + Sr |  | 19.0 | 19.0 | 17.3 | 14.5 | 14.5 | 14.5 | 16.3 | 17.3 |
| Na/(Li + Na + K + Mg + Ca + Sr + Ba) |  | 0.138 | 0.138 | 0.138 | 0.138 | 0.138 | 0.138 | 0.193 | 0.192 |
| α[30-380° C.] (×10$^{-7}$/° C.) |  | 80 | 80 | 80 | 83 | 83 | 83 | 81 | 83 |
| d(g/cm$^3$) |  | 2.83 | 2.84 | 2.84 | 2.80 | 2.79 | 2.80 | 2.79 | 2.82 |
| Ps (° C.) |  | Not measured | 647 | 645 | 631 | 624 | 625 | 627 | 626 |
| Ta (° C.) |  | Not measured | 694 | 692 | 679 | 671 | 672 | 674 | 672 |
| Ts (° C.) |  | Not measured | 891 | 892 | 881 | 874 | 875 | 875 | 867 |
| 10$^4$ dPa · s (° C.) |  | 1,168 | 1,178 | 1,181 | 1,187 | 1,185 | 1,187 | 1,176 | 1,159 |
| 10$^3$ dPa · s (° C.) |  | 1,313 | 1,326 | 1,331 | 1,347 | 1,348 | 1,350 | 1,333 | 1,309 |
| 10$^{2.5}$ dPa · s (° C.) |  | 1,408 | 1,423 | 1,428 | 1,453 | 1,455 | 1,457 | 1,437 | 1,409 |
| 10$^2$ dPa · s (° C.) |  | 1,531 | 1,542 | 1,551 | 1,582 | 1,589 | 1,589 | 1,567 | 1,533 |
| TL (° C.) |  | 1,150 | 1,140 | 1,135 | 1,126 | 1,131 | 1,123 | 1,124 | 1,104 |
| log$_{10}$ηTL (dPa · s) |  | 4.2 | 4.3 | 4.4 | 4.5 | 4.4 | 4.5 | 4.4 | 4.5 |

TABLE 1-continued

| | Example | | | | | | | |
|---|---|---|---|---|---|---|---|---|
| | No. 1 | No. 2 | No. 3 | No. 4 | No. 5 | No. 6 | No. 7 | No. 8 |
| ρ (150° C.) | Not measured | Not measured | Not measured | Not measured | Not measured | Not measured | 11.0 | 11.4 |
| ρ (250° C.) | Not measured | Not measured | Not measured | Not measured | Not measured | Not measured | 8.6 | 8.9 |
| ρ (350° C.) | Not measured | Not measured | Not measured | Not measured | Not measured | Not measured | 7.0 | 7.2 |
| ε | Not measured | Not measured | Not measured | Not measured | Not measured | Not measured | 7.7 | 7.8 |
| tanδ | Not measured | Not measured | Not measured | Not measured | Not measured | Not measured | 0.004 | 0.003 |

TABLE 2

| | | Example | | | | | | | |
|---|---|---|---|---|---|---|---|---|---|
| | | No. 9 | No. 10 | No. 11 | No. 12 | No. 13 | No. 14 | No. 15 | No. 16 |
| Glass composition (wt %) | $SiO_2$ | 50.8 | 51.0 | 52.8 | 52.5 | 51.0 | 51.0 | 51.0 | 51.0 |
| | $Al_2O_3$ | 13.0 | 13.0 | 13.0 | 13.0 | 13.0 | 13.0 | 13.0 | 13.0 |
| | MgO | 0.1 | 1.0 | 1.0 | 0.1 | 1.0 | 1.0 | 1.0 | 0.1 |
| | CaO | 5.4 | 4.5 | 6.5 | 5.4 | 6.5 | 4.5 | 6.5 | 5.4 |
| | SrO | 10.9 | 6.9 | 9.1 | 11.9 | 9.1 | 11.9 | 6.9 | 9.1 |
| | BaO | 4.5 | 8.5 | 4.3 | 3.5 | 4.3 | 3.5 | 6.5 | 6.3 |
| | $Na_2O$ | 5.8 | 5.0 | 5.0 | 6.0 | 5.0 | 5.0 | 5.0 | 5.0 |
| | $K_2O$ | 4.6 | 5.3 | 5.3 | 4.3 | 5.3 | 5.3 | 5.3 | 5.3 |
| | $ZrO_2$ | 4.6 | 4.6 | 2.6 | 3.1 | 4.6 | 4.6 | 4.6 | 4.6 |
| | $Fe_2O_3$ | 0.20 | 0.10 | 0.30 | 0.10 | 0.15 | 0.10 | 0.10 | 0.10 |
| | $SO_3$ | 0.10 | 0.10 | 0.10 | 0.10 | 0.05 | 0.10 | 0.10 | 0.10 |
| Si − Al | | 37.9 | 38.0 | 39.8 | 39.5 | 38.0 | 38.0 | 38.0 | 38.0 |
| Na + K | | 10.4 | 10.3 | 10.3 | 10.3 | 10.3 | 10.3 | 10.3 | 10.3 |
| Mg + Ca + Sr + Ba | | 20.9 | 20.9 | 20.9 | 20.9 | 20.9 | 20.9 | 20.9 | 20.9 |
| Mg + Ca | | 5.5 | 5.5 | 7.5 | 5.5 | 7.5 | 5.5 | 7.5 | 5.5 |
| Ca/Mg | | 54.0 | 4.5 | 6.5 | 54.0 | 6.5 | 4.5 | 6.5 | 54.0 |
| Ca + Sr | | 16.3 | 11.4 | 15.6 | 17.3 | 15.6 | 16.4 | 13.4 | 14.5 |
| Na/(Li + Na + K + Mg + Ca + Sr + Ba) | | 0.184 | 0.160 | 0.160 | 0.192 | 0.160 | 0.160 | 0.160 | 0.160 |
| α[30-380° C.] (×$10^{-7}$/° C.) | | 83 | 82 | 83 | 84 | 81 | 82 | 82 | 82 |
| d(g/$cm^3$) | | 2.83 | 2.83 | 2.76 | 2.79 | 2.81 | 2.82 | 2.81 | 2.83 |
| Ps (° C.) | | 626 | 625 | 616 | 613 | 630 | 630 | 629 | 630 |
| Ta (° C.) | | 673 | 672 | 662 | 659 | 677 | 677 | 675 | 677 |
| Ts (° C.) | | 870 | 881 | 863 | 855 | 875 | 878 | 876 | 879 |
| $10^4$ dPa · s (° C.) | | 1,164 | 1,186 | 1,164 | 1,154 | 1,165 | 1,174 | 1,170 | 1,178 |
| $10^3$ dPa · s (° C.) | | 1,317 | 1,342 | 1,321 | 1,311 | 1,314 | 1,326 | 1,321 | 1,331 |
| $10^{2.5}$ dPa · s (° C.) | | 1,418 | 1,444 | 1,424 | 1,416 | 1,411 | 1,425 | 1,419 | 1,431 |
| $10^2$ dPa · s (° C.) | | 1,544 | 1,569 | 1,548 | 1,547 | 1,528 | 1,545 | 1,539 | 1,550 |
| TL (° C.) | | 1,098 | 1,126 | 1,112 | 1,109 | 1,121 | 1,098 | 1,135 | 1,096 |
| $\log_{10}\eta TL$ (dPa · s) | | 4.6 | 4.5 | 4.4 | 4.4 | 4.4 | 4.7 | 4.3 | 4.7 |
| ρ (150° C.) | | 11.4 | 11.8 | 11.0 | 11.2 | 11.5 | Not measured | 11.7 | 11.6 |
| ρ (250° C.) | | 8.9 | 9.1 | 8.8 | 8.7 | 9.0 | Not measured | 9.1 | 9.0 |
| ρ (350° C.) | | 7.2 | 7.3 | 7.3 | 7.1 | 7.3 | Not measured | 7.3 | 7.3 |
| ε | | 7.8 | 7.8 | 7.6 | 7.7 | 7.8 | Not measured | 7.8 | 7.8 |
| tanδ | | 0.003 | 0.003 | 0.003 | 0.003 | 0.002 | Not measured | 0.002 | 0.003 |
| Young's modulus (GPa) | | Not measured | Not measured | 80.0 | Not measured | 81.0 | Not measured | Not measured | 80.8 |

TABLE 3

| | | Example | | | | | | | |
|---|---|---|---|---|---|---|---|---|---|
| | | No. 17 | No. 18 | No. 19 | No. 20 | No. 21 | No. 22 | No. 23 | No. 24 |
| Glass composition (wt %) | $SiO_2$ | 50.7 | 51.0 | 51.0 | 51.0 | 51.0 | 50.0 | 50.0 | 53.0 |
| | $Al_2O_3$ | 13.0 | 12.0 | 13.0 | 13.0 | 12.0 | 12.0 | 12.0 | 13.0 |
| | MgO | 0.1 | 0.1 | 0.1 | 1.0 | 0.1 | 0.1 | 0.1 | 0.1 |
| | CaO | 3.4 | 3.9 | 5.4 | 4.5 | 3.9 | 3.9 | 3.9 | 5.4 |
| | SrO | 9.1 | 11.4 | 9.9 | 9.1 | 8.4 | 8.4 | 8.4 | 9.1 |
| | BaO | 8.3 | 5.5 | 5.5 | 6.3 | 8.5 | 9.5 | 8.5 | 6.3 |
| | $Na_2O$ | 5.0 | 5.5 | 5.5 | 5.0 | 5.5 | 5.5 | 5.5 | 5.0 |
| | $K_2O$ | 5.3 | 4.8 | 4.8 | 5.3 | 4.8 | 4.8 | 5.8 | 5.3 |
| | $ZrO_2$ | 4.6 | 5.6 | 4.6 | 4.6 | 5.6 | 5.6 | 5.6 | 2.6 |
| | $Fe_2O_3$ | 0.40 | 0.10 | 0.10 | 0.10 | 0.10 | 0.10 | 0.10 | 0.10 |
| | $SO_3$ | 0.10 | 0.10 | 0.10 | 0.10 | 0.10 | 0.10 | 0.10 | 0.10 |
| Si − Al | | 37.7 | 39.0 | 38.0 | 38.0 | 39.0 | 38.0 | 38.0 | 40.0 |
| Na + K | | 10.3 | 10.3 | 10.3 | 10.3 | 10.3 | 10.3 | 11.3 | 10.3 |
| Mg + Ca + Sr + Ba | | 20.9 | 20.9 | 20.9 | 20.9 | 20.9 | 21.9 | 20.9 | 20.9 |
| Mg + Ca | | 3.5 | 4.0 | 5.5 | 5.5 | 4.0 | 4.0 | 4.0 | 5.5 |
| Ca/Mg | | 34.0 | 39.0 | 54.0 | 4.5 | 39.0 | 39.0 | 39.0 | 54.0 |
| Ca + Sr | | 12.5 | 15.3 | 15.3 | 13.6 | 12.3 | 12.3 | 12.3 | 14.5 |
| Na/(Li + Na + K + Mg + Ca + Sr + Ba) | | 0.160 | 0.176 | 0.176 | 0.160 | 0.176 | 0.171 | 0.171 | 0.160 |
| α[30-380° C.] ($\times 10^{-7}$/° C.) | | 82 | 83 | 83 | 82 | 82 | 83 | 85 | 82 |
| d(g/$cm^3$) | | 2.84 | 2.85 | 2.83 | 2.82 | 2.86 | 2.88 | 2.86 | 2.78 |
| Ps (° C.) | | 628 | 628 | 628 | 626 | 625 | 624 | 620 | 614 |
| Ta (° C.) | | 676 | 675 | 674 | 674 | 672 | 671 | 667 | 661 |
| Ts (° C.) | | 884 | 876 | 873 | 880 | 877 | 874 | 871 | 864 |
| $10^4$ dPa · s (° C.) | | 1,197 | 1,176 | 1,180 | 1,180 | 1,180 | 1,172 | 1,173 | 1,166 |
| $10^3$ dPa · s (° C.) | | 1,358 | 1,328 | 1,336 | 1,336 | 1,335 | 1,325 | 1,327 | 1,330 |
| $10^{2.5}$ dPa · s (° C.) | | 1,464 | 1,428 | 1,439 | 1,438 | 1,437 | 1,425 | 1,427 | 1,436 |
| $10^2$ dPa · s (° C.) | | 1,594 | 1,550 | 1,565 | 1,563 | 1,562 | 1,544 | 1,549 | 1,561 |
| TL (° C.) | | 1,106 | 1,076 | 1,096 | 1,098 | 1,071 | 1,079 | 1,077 | 1,114 |
| $\log_{10} \eta$TL (dPa · s) | | 4.8 | 4.9 | 4.7 | 4.7 | 5.0 | 4.8 | 4.8 | 4.4 |
| ρ (150° C.) | | 11.7 | Not measured | 11.6 | 11.8 | 11.7 | 11.8 | 11.8 | 11.5 |
| ρ (250° C.) | | 9.1 | Not measured | 9.0 | 9.2 | 9.0 | 9.1 | 9.1 | 8.9 |
| ρ (350° C.) | | 7.3 | Not measured | 7.2 | 7.4 | 7.2 | 7.3 | 7.3 | 7.2 |
| ε | | 7.8 | Not measured | 7.8 | 7.8 | 7.9 | 7.9 | 7.9 | 7.6 |
| tanδ | | 0.003 | Not measured | 0.003 | 0.003 | 0.003 | 0.002 | 0.002 | 0.003 |
| Young's modulus | | Not measured | Not measured | Not measured | Not measured | 80.4 | 80.5 | 80.9 | Not measured |

TABLE 4

| | | Example | | | | | | | |
|---|---|---|---|---|---|---|---|---|---|
| | | No. 25 | No. 26 | No. 27 | No. 28 | No. 29 | No. 30 | No. 31 | No. 32 |
| Glass composition (wt %) | $SiO_2$ | 50.5 | 53.0 | 53.6 | 51.0 | 53.5 | 51.0 | 49.1 | 50.1 |
| | $Al_2O_3$ | 12.5 | 13.0 | 14.9 | 13.0 | 12.4 | 13.0 | 13.0 | 13.0 |
| | $B_2O_3$ | — | — | — | — | — | — | 1.9 | 0.9 |
| | MgO | 0.1 | 1.1 | 1.0 | 0.1 | 0.1 | 0.1 | 0.1 | 0.1 |
| | CaO | 3.9 | 7.7 | 7.8 | 6.5 | 5.1 | 5.4 | 5.4 | 5.4 |
| | SrO | 8.4 | 9.1 | 9.1 | 11.8 | 11.2 | 11.9 | 11.9 | 11.9 |
| | BaO | 8.5 | 3.0 | 3.0 | 2.5 | 3.3 | 3.5 | 3.5 | 3.5 |
| | $Na_2O$ | 5.5 | 5.0 | 5.0 | 5.0 | 5.7 | 6.0 | 6.0 | 6.0 |
| | $K_2O$ | 4.8 | 5.3 | 5.3 | 5.3 | 4.1 | 4.3 | 4.3 | 4.3 |
| | $ZrO_2$ | 5.6 | 2.6 | 0.1 | 4.6 | 4.4 | 4.6 | 4.6 | 4.6 |
| | $Fe_2O_3$ | 0.10 | 0.10 | 0.10 | 0.10 | 0.01 | 0.01 | 0.01 | 0.01 |
| | $SO_3$ | 0.10 | 0.10 | 0.10 | 0.10 | 0.19 | 0.19 | 0.19 | 0.19 |
| Si − Al | | 38.0 | 40.0 | 38.7 | 38.0 | 41.1 | 38.0 | 36.1 | 37.1 |
| Na + K | | 10.3 | 10.3 | 10.3 | 10.3 | 9.8 | 10.3 | 10.3 | 10.3 |
| Mg + Ca + Sr + Ba | | 20.9 | 20.9 | 20.9 | 20.9 | 19.7 | 20.9 | 20.9 | 20.9 |
| Mg + Ca | | 4.0 | 8.8 | 8.8 | 6.6 | 5.2 | 5.5 | 5.5 | 5.5 |
| Ca/Mg | | 39.0 | 7.0 | 7.8 | 65.0 | 51.0 | 54.0 | 54.0 | 54.0 |
| Ca + Sr | | 12.3 | 16.8 | 16.9 | 18.3 | 16.3 | 17.3 | 17.3 | 17.3 |

TABLE 4-continued

| | Example | | | | | | | |
|---|---|---|---|---|---|---|---|---|
| | No. 25 | No. 26 | No. 27 | No. 28 | No. 29 | No. 30 | No. 31 | No. 32 |
| Na/(Li + Na + K + Mg + Ca + Sr + Ba) | 0.176 | 0.160 | 0.160 | 0.160 | 0.193 | 0.192 | 0.192 | 0.192 |
| α[30-380° C.] (×$10^{-7}$/° C.) | 82 | 83 | 84 | 83 | 81 | 83 | 84 | 84 |
| d(g/cm³) | 2.86 | 2.75 | 2.71 | 2.81 | 2.79 | 2.82 | 2.82 | 2.82 |
| Ps (° C.) | 629 | 620 | 614 | 637 | 627 | 626 | 613 | 620 |
| Ta (° C.) | 676 | 665 | 660 | 683 | 674 | 672 | 656 | 665 |
| Ts (° C.) | 882 | 862 | 858 | 877 | 875 | 867 | 839 | 854 |
| $10^4$ dPa·s (° C.) | 1,185 | 1,153 | 1,162 | 1,166 | 1,176 | 1,159 | 1,121 | 1,141 |
| $10^3$ dPa·s (° C.) | 1,340 | 1,306 | 1,324 | 1,314 | 1,333 | 1,309 | 1,269 | 1,290 |
| $10^{2.5}$ dPa·s (° C.) | 1,441 | 1,406 | 1,431 | 1,412 | 1,437 | 1,409 | 1,486 | 1,511 |
| $10^2$ dPa·s (° C.) | 1,565 | 1,530 | 1,501 | 1,532 | 1,567 | 1,533 | 1,505 | 1,540 |
| TL (° C.) | 1,140 | 1,151 | 1,153 | 1,145 | 1,124 | 1,104 | 1,065 | 1,084 |
| $\log_{10}\eta$TL (dPa·s) | 4.4 | 4.0 | 4.1 | 4.2 | 4.4 | 4.5 | 4.5 | 4.5 |
| ρ (150° C.) | 11.6 | 11 | 11.1 | Not measured | 11.0 | 11.4 | 11.5 | 11.4 |
| ρ (250° C.) | 9 | 8.8 | 8.7 | Not measured | 8.6 | 8.9 | Not measured | Not measured |
| ρ (350° C.) | 7.2 | 7.3 | 7.2 | Not measured | 7.0 | 7.2 | Not measured | Not measured |
| ε | 7.8 | 7.6 | 7.5 | Not measured | 7.7 | 7.8 | 7.6 | 7.6 |
| tanδ | 0.003 | 0.003 | 0.003 | Not measured | 0.004 | 0.003 | Not measured | Not measured |

TABLE 5

| | | Example | | | Comparative Example | | |
|---|---|---|---|---|---|---|---|
| | | No. 33 | No. 34 | No. 35 | No. 36 | No. 37 | No. 38 |
| Glass composition (wt %) | $SiO_2$ | 50.6 | 51.0 | 51.0 | 59.9 | 55.8 | 57.8 |
| | $Al_2O_3$ | 13.0 | 13.0 | 13.0 | 17.0 | 7.0 | 7.0 |
| | $B_2O_3$ | 0.4 | — | — | 7.8 | — | — |
| | MgO | 0.1 | 3.8 | 0.1 | 3.3 | 2.0 | 2.0 |
| | CaO | 5.4 | 3.0 | 3.0 | 4.2 | 2.0 | 5.0 |
| | SrO | 11.9 | 8.9 | 3.0 | 7.7 | 9.0 | 7.0 |
| | BaO | 3.5 | 5.5 | 15.1 | 0.1 | 8.5 | 8.0 |
| | $Na_2O$ | 6.0 | 4.8 | 4.3 | — | 4.5 | 4.0 |
| | $K_2O$ | 4.3 | 5.2 | 5.7 | — | 6.5 | 7.0 |
| | $ZrO_2$ | 4.6 | 4.6 | 4.6 | — | 4.5 | 2.0 |
| | $Fe_2O_3$ | 0.01 | 0.10 | 0.10 | 0.00 | 0.10 | 0.10 |
| | $SO_3$ | 0.19 | 0.10 | 0.10 | 0.00 | 0.10 | 0.10 |
| Si − Al | | 37.6 | 38.0 | 38.0 | 42.9 | 48.8 | 50.8 |
| Na + K | | 10.3 | 10.0 | 10.0 | — | 11.0 | 11.0 |
| Mg + Ca + Sr + Ba | | 20.9 | 21.2 | 21.2 | 15.3 | 21.5 | 22.0 |
| Mg + Ca | | 5.5 | 6.8 | 3.1 | 7.5 | 4.0 | 7.0 |
| Ca/Mg | | 54.0 | 0.8 | 30 | 1.3 | 1.0 | 2.5 |
| Ca + Sr | | 17.3 | 11.9 | 6.0 | 11.9 | 11.0 | 12.0 |
| Na/(Li + Na + K + Mg + Ca + Sr + Ba) | | 0.192 | 0.154 | 0.138 | 0 | 0.138 | 0.121 |
| α[30-380° C.] (×$10^{-7}$/° C.) | | 84 | 83 | 82 | 37 | 85 | 85 |
| d(g/cm³) | | 2.82 | 2.81 | 2.84 | 2.50 | 2.82 | 2.77 |
| Ps (° C.) | | 623 | 627 | 610 | 660 | 580 | 570 |
| Ta (° C.) | | 669 | 675 | 659 | Not measured | 630 | 620 |
| Ts (° C.) | | 861 | 881 | 876 | Not measured | 840 | 830 |
| $10^4$ dPa·s (° C.) | | 1,151 | 1,177 | 1,209 | 1,268 | 1,150 | 1,130 |
| $10^3$ dPa·s (° C.) | | 1,300 | 1,329 | 1,374 | Not measured | 1,310 | 1,300 |
| $10^{2.5}$ dPa·s (° C.) | | 1,523 | 1,428 | 1,465 | 1,660 | 1,410 | 1,400 |
| $10^2$ dPa·s (° C.) | | 1,550 | 1,549 | Not measured | Not measured | Not measured | Not measured |
| TL (° C.) | | 1,094 | >1,320 | Not measured | Not measured | Not measured | Not measured |
| $\log_{10}\eta$TL (dPa·s) | | 4.5 | <3.0 | Not measured | Not measured | Not measured | Not measured |

TABLE 5-continued

|  | Example | | | Comparative Example | | |
|---|---|---|---|---|---|---|
|  | No. 33 | No. 34 | No. 35 | No. 36 | No. 37 | No. 38 |
| ρ (150° C.) | 11.4 | Not measured | Not measured | Not measured | Not measured | Not measured |
| ∈ | 7.6 | Not measured | Not measured | Not measured | Not measured | Not measured |

TABLE 6

|  |  | Example | | | | | | |
|---|---|---|---|---|---|---|---|---|
|  |  | No. 39 | No. 40 | No. 41 | No. 42 | No. 43 | No. 44 | No. 45 |
| Glass composition (wt %) | $SiO_2$ | 51.0 | 51.2 | 50.9 | 50.2 | 52.7 | 48.7 | 48.8 |
|  | $Al_2O_3$ | 13.0 | 13.0 | 14.0 | 13.0 | 9.0 | 17.0 | 17.9 |
|  | $B_2O_3$ | — | — | — | — | — | — | — |
|  | MgO | 0.1 | 0.1 | 0.1 | 0.1 | 0.1 | 0.1 | 0.1 |
|  | CaO | 5.5 | 5.3 | 4.8 | 5.5 | 4.0 | 4.0 | 4.0 |
|  | SrO | 12.0 | 12.0 | 11.0 | 12.0 | 10.0 | 11.0 | 11.0 |
|  | BaO | 3.0 | 4.0 | 3.0 | 3.0 | 5.5 | 5.5 | 5.5 |
|  | $Na_2O$ | 6.5 | 7.0 | 8.0 | 7.3 | 5.0 | 5.0 | 5.0 |
|  | $K_2O$ | 3.7 | 3.2 | 3.0 | 4.2 | 5.5 | 4.5 | 4.5 |
|  | $ZrO_2$ | 5.0 | 4.0 | 5.0 | 4.5 | 8.0 | 4.0 | 3.0 |
|  | $Fe_2O_3$ | 0.1 | 0.1 | 0.1 | 0.1 | 0.1 | 0.1 | 0.1 |
|  | $SO_3$ | 0.1 | 0.1 | 0.1 | 0.1 | 0.1 | 0.1 | 0.1 |
| Si − Al |  | 38 | 38.2 | 36.9 | 37.2 | 43.7 | 31.7 | 30.9 |
| Na + K |  | 10.2 | 10.2 | 11 | 11.5 | 10.5 | 9.5 | 9.5 |
| Mg + Ca + Sr + Ba |  | 20.6 | 21.4 | 18.9 | 21 | 19.6 | 20.6 | 20.6 |
| Mg + Ca |  | 5.6 | 5.4 | 4.9 | 6 | 4.1 | 4.1 | 4.1 |
| Ca/Mg |  | 55.0 | 53.0 | 48.0 | 55.0 | 40.0 | 40.0 | 40.0 |
| Ca + Sr |  | 17.5 | 17.3 | 15.8 | 18.0 | 14.0 | 15.0 | 15.0 |
| Na/(Li + Na + K + Mg + Ca + Sr + Ba) |  | 0.211 | 0.222 | 0.268 | 0.227 | 0.166 | 0.166 | 0.166 |
| α[30-380° C.] ($\times 10^{-7}/°$ C.) |  | 84 | 86 | 87 | 86 | 80 | 80 | 81 |
| d (g/cm³) |  | 2.82 | 2.82 | 2.81 | 2.83 | 2.85 | 2.82 | 2.80 |
| Ps (° C.) |  | 626 | 611 | 612 | 612 | 634 | 649 | 646 |
| Ta (° C.) |  | 671 | 656 | 657 | 657 | 681 | 698 | 695 |
| Ts (° C.) |  | 866 | 851 | 852 | 849 | 876 | 893 | 890 |
| $10^4$ dPa·s (° C.) |  | 1,157 | 1,139 | 1,144 | 1,140 | 1,179 | 1,197 | 1,195 |
| $10^3$ dPa·s (° C.) |  | 1,304 | 1,289 | 1,299 | 1,285 | 1,335 | 1,366 | 1,369 |
| $10^{2.5}$ dPa·s (° C.) |  | 1,403 | 1,390 | 1,403 | 1,382 | 1,432 | 1,476 | 1,483 |
| $10^2$ dPa·s (° C.) |  | 1,521 | 1,490 | 1,520 | 1,500 | 1,560 | 1,570 | 1,580 |
| TL (° C.) |  | 1,111 | 1,093 | 1,096 | 1,100 | 1,142 | 1,135 | 1,144 |
| $\log_{10}\eta$TL (dPa·s) |  | 4.4 | 4.4 | 4.4 | 4.4 | 4.3 | 4.5 | 4.4 |
| ρ (150° C.) |  | 11.6 | 11.5 | 11.4 | 11.3 | 11.5 | 11.5 | 11.5 |
| ρ (250° C.) |  | 8.5 | 8.4 | 8.3 | 8.3 | 8.4 | 8.4 | 8.4 |
| ρ (350° C.) |  | 7.1 | 7.0 | 6.0 | 6.8 | 7.0 | 7.0 | 7.0 |
| ∈ |  | 7.8 | 7.7 | 7.8 | 7.8 | 7.8 | 7.7 | 7.8 |
| tanδ |  | 0.003 | 0.003 | 0.003 | 0.003 | 0.003 | 0.003 | 0.003 |

Sample Nos. 1 to 45 were produced in the following manner. First, glass batches were blended so that each of the glass compositions in the tables was attained, and then the glass batches were loaded into a platinum crucible and were melt at 1,550° C. for 2 hours. Next, the resultant molten glass was caused to flow on a carbon plate to be formed into a plate shape, followed by annealing. After that, predetermined processing was performed in accordance with each measurement. Each of the resultant samples was evaluated for its thermal expansion coefficient α, density d, strain point Ps, annealing temperature Ta, softening temperature Ts, temperature at $10^4$ dPa·s, temperature at $10^3$ dPa·s, temperature at $10^{2.5}$ dPa·s, temperature at $10^2$ dPa·s, liquidus temperature TL, liquidus viscosity $\log_{10} \eta$TL, volume electric resistivities ρ (150° C., 250° C., 350° C.), dielectric constant ∈, dielectric dissipation factor tan δ, Young's modulus, and specific Young's modulus. Tables 1 to 6 show those results.

The thermal expansion coefficient α refers to an average thermal expansion coefficient in the temperature range of 30 to 380° C. calculated from the values measured with a dilatometer. Note that a cylindrical sample having a diameter of 5.0 mm and a length of 20 mm was used as a measurement sample.

The density d refers to a value measured by a well-known Archimedes method.

The strain point Ps, the annealing temperature Ta, and the softening temperature Ts are values measured on the basis of ASTM C336-71.

The temperature at $10^4$ dPa·s, the temperature at $10^3$ dPa·s, and the temperature at $10^{2.5}$ dPa·s are values measured by a platinum sphere pull up method. Note that the temperature at $10^4$ dPa·s corresponds to a formation temperature.

The liquidus temperature TL refers to a value obtained by measuring a temperature at which crystals of glass are deposited after glass powder that passed through a standard 30-mesh sieve (500 μm) and remained on a 50-mesh sieve (300 μm) is placed in a platinum boat and then the platinum boat is kept for 24 hours in a gradient heating furnace. The liquidus viscosity $\log_{10} \eta TL$ refers to a value obtained by measuring the viscosity of glass at a liquidus temperature TL by a platinum sphere pull up method. Note that, as the liquidus temperature is lower or as the liquidus viscosity is higher, the denitrification resistance improves, and hence devitrified crystals are difficult to precipitate in glass at the time of the forming thereof. As a result, large glass sheets can be easily manufactured at low cost.

The volume electric resistivity ρ refers to a value measured on the basis of ASTM C657-78 at each temperature.

The dielectric constant ∈ and the dielectric dissipation factor tan δ refer to values measured under the conditions of 25° C. and 1 MHz on the basis of ASTM D150-87.

The Young's modulus refers to a value measured by a resonance method. In addition, the specific Young's modulus refers to a value obtained by dividing the Young's modulus by the density.

As evident from Tables 1 to 6, each of Sample Nos. 1 to 35 and 39 to 45 has a strain point of more than 600° C. to 650° C., thus having high heat resistance. Further, each of Sample Nos. 1 to 35 and 39 to 45 has a thermal expansion coefficient of 70 to $100 \times 10^{-7}/°$ C., and hence the thermal expansion coefficient easily matches those of an electrode film and photoelectric conversion film in a thin-film solar cell. In addition, each of Sample Nos. 1 to 33 and 39 to 45 has a temperature at $10^4$ dPa·s of less than 1,200° C. and has a liquidus viscosity of $10^{4.0}$ dPa·s or more, and hence each of the samples is excellent in productivity.

On the other hand, Sample No. 36 has a high strain point but does not comprise any alkali component, in particular, $Na_2O$, and hence it may be difficult to enhance the photoelectric conversion efficiency of a CIS-based solar cell. Besides, Sample No. 36 has an excessively low thermal expansion coefficient, and hence it may be difficult to match the thermal expansion coefficient to those of an electrode film and photoelectric conversion film in a thin-film solar cell.

Sample Nos. 37 and 38 are general-purpose glass sheets. Of those, Sample No. 38 is a glass sheet described in Patent Literature 1. Each of Sample Nos. 37 and 38 has a strain point of about 580° C. or less, and hence each of the glass sheets is liable to have thermal deformation and thermal shrinkage in a heat treatment step, with the result that it may be impossible to enhance sufficiently the photoelectric conversion efficiency of a thin-film solar cell.

Example 2

Examples of Related Invention

Examples of the related invention are described below. Note that the following examples are merely for illustrative purposes. The related invention is by no means limited to the following examples.

Tables 7 to 12 show Examples of the related invention (Sample Nos. 46 to 78 and 81 to 84) and Comparative Examples (Sample Nos. 79 and 80).

TABLE 7

|  |  | Example |  |  |  |  |  |  |  |
|---|---|---|---|---|---|---|---|---|---|
|  |  | No. 46 | No. 47 | No. 48 | No. 49 | No. 50 | No. 51 | No. 52 | No. 53 |
| Glass composition (wt %) | $SiO_2$ | 51.0 | 51.0 | 51.0 | 52.0 | 53.0 | 53.0 | 53.5 | 51.0 |
|  | $Al_2O_3$ | 13.0 | 13.0 | 13.0 | 13.0 | 13.0 | 13.0 | 12.4 | 13.0 |
|  | MgO | 0.1 | 0.1 | 0.1 | 0.1 | 0.1 | 0.1 | 0.1 | 0.1 |
|  | CaO | 7.1 | 5.4 | 5.4 | 5.4 | 5.4 | 5.4 | 5.1 | 5.4 |
|  | SrO | 11.9 | 13.6 | 11.9 | 9.1 | 9.1 | 9.1 | 11.2 | 11.9 |
|  | BaO | 3.5 | 3.5 | 5.2 | 6.3 | 6.3 | 6.7 | 3.3 | 3.5 |
|  | $Na_2O$ | 4.3 | 4.3 | 4.3 | 4.3 | 4.3 | 4.3 | 5.7 | 6.0 |
|  | $K_2O$ | 4.3 | 4.3 | 4.3 | 6.0 | 6.0 | 5.6 | 4.1 | 4.3 |
|  | $ZrO_2$ | 4.6 | 4.6 | 4.6 | 3.6 | 2.6 | 2.6 | 4.4 | 4.6 |
|  | $Fe_2O_3$ | 0.10 | 0.10 | 0.10 | 0.10 | 0.10 | 0.10 | 0.10 | 0.10 |
|  | $SO_3$ | 0.10 | 0.10 | 0.10 | 0.10 | 0.10 | 0.10 | 0.10 | 0.10 |
| Si − Al |  | 38.0 | 38.0 | 38.0 | 39.0 | 40.0 | 40.0 | 41.1 | 38.0 |
| Mg + Ca + Sr + Ba |  | 22.6 | 22.6 | 22.6 | 20.9 | 20.9 | 21.3 | 19.7 | 20.9 |
| Mg + Ca |  | 7.2 | 5.5 | 5.5 | 5.5 | 5.5 | 5.5 | 5.2 | 5.5 |
| Ca/Mg |  | 71.0 | 54.0 | 54.0 | 54.0 | 54.0 | 54.0 | 51.0 | 54.0 |
| Ca + Sr |  | 19.0 | 19.0 | 17.3 | 14.5 | 14.5 | 14.5 | 16.3 | 17.3 |
| Na/(Li + Na + K + Mg + Ca + Sr + Ba) |  | 0.138 | 0.138 | 0.138 | 0.138 | 0.138 | 0.138 | 0.193 | 0.192 |
| α[30-380° C.] ($\times 10^{-7}/°$ C.) |  | 80 | 80 | 80 | 83 | 83 | 83 | 81 | 83 |
| d(g/cm$^3$) |  | 2.83 | 2.84 | 2.84 | 2.80 | 2.79 | 2.80 | 2.79 | 2.82 |
| Ps (° C.) |  | Not | 647 | 645 | 631 | 624 | 625 | 627 | 626 |
| Ta (° C.) |  | Not | 694 | 692 | 679 | 671 | 672 | 674 | 672 |
| Ts (° C.) |  | Not | 891 | 892 | 881 | 874 | 875 | 875 | 867 |
| $10^4$ dPa·s (° C.) |  | 1,168 | 1,178 | 1,181 | 1,187 | 1,185 | 1,187 | 1,176 | 1,159 |
| $10^3$ dPa·s (° C.) |  | 1,313 | 1,326 | 1,331 | 1,347 | 1,348 | 1,350 | 1,333 | 1,309 |
| $10^{2.5}$ dPa·s (° C.) |  | 1,408 | 1,423 | 1,428 | 1,453 | 1,455 | 1,457 | 1,437 | 1,409 |
| $10^2$ dPa·s (° C.) |  | 1,531 | 1,542 | 1,551 | 1,582 | 1,589 | 1,589 | 1,567 | 1,533 |
| TL (° C.) |  | 1,150 | 1,140 | 1,135 | 1,126 | 1,131 | 1,123 | 1,124 | 1,104 |
| $\log_{10}\eta TL$ (dPa·s) |  | 4.2 | 4.3 | 4.4 | 4.5 | 4.4 | 4.5 | 4.4 | 4.5 |
| ρ (150° C.) |  | Not measured | Not measured | Not measured | Not measured | Not measured | Not measured | 11.0 | 11.4 |
| ρ (250° C.) |  | Not measured | Not measured | Not measured | Not measured | Not measured | Not measured | 8.6 | 8.9 |
| ρ (350° C.) |  | Not measured | Not measured | Not measured | Not measured | Not measured | Not measured | 7.0 | 7.2 |
| ∈ |  | Not measured | Not measured | Not measured | Not measured | Not measured | Not measured | 7.7 | 7.8 |
| tan δ |  | Not measured | Not measured | Not measured | Not measured | Not measured | Not measured | 0.004 | 0.003 |

TABLE 8

| | | Example | | | | | | | |
|---|---|---|---|---|---|---|---|---|---|
| | | No. 54 | No. 55 | No. 56 | No. 57 | No. 58 | No. 59 | No. 60 | No. 61 |
| Glass composition (wt %) | $SiO_2$ | 50.8 | 51.0 | 52.8 | 52.5 | 51.0 | 51.0 | 51.0 | 51.0 |
| | $Al_2O_3$ | 13.0 | 13.0 | 13.0 | 13.0 | 13.0 | 13.0 | 13.0 | 13.0 |
| | MgO | 0.1 | 1.0 | 1.0 | 0.1 | 1.0 | 1.0 | 1.0 | 0.1 |
| | CaO | 5.4 | 4.5 | 6.5 | 5.4 | 6.5 | 4.5 | 6.5 | 5.4 |
| | SrO | 10.9 | 6.9 | 9.1 | 11.9 | 9.1 | 11.9 | 6.9 | 9.1 |
| | BaO | 4.5 | 8.5 | 4.3 | 3.5 | 4.3 | 3.5 | 6.5 | 6.3 |
| | $Na_2O$ | 5.8 | 5.0 | 5.0 | 6.0 | 5.0 | 5.0 | 5.0 | 5.0 |
| | $K_2O$ | 4.6 | 5.3 | 5.3 | 4.3 | 5.3 | 5.3 | 5.3 | 5.3 |
| | $ZrO_2$ | 4.6 | 4.6 | 2.6 | 3.1 | 4.6 | 4.6 | 4.6 | 4.6 |
| | $Fe_2O_3$ | 0.20 | 0.10 | 0.30 | 0.10 | 0.15 | 0.10 | 0.10 | 0.10 |
| | $SO_3$ | 0.10 | 0.10 | 0.10 | 0.10 | 0.05 | 0.10 | 0.10 | 0.10 |
| Si – Al | | 37.9 | 38.0 | 39.8 | 39.5 | 38.0 | 38.0 | 38.0 | 38.0 |
| Mg + Ca + Sr + Ba | | 20.9 | 20.9 | 20.9 | 20.9 | 20.9 | 20.9 | 20.9 | 20.9 |
| Mg + Ca | | 5.5 | 5.5 | 7.5 | 5.5 | 7.5 | 5.5 | 7.5 | 5.5 |
| Ca/Mg | | 54.0 | 4.5 | 6.5 | 54.0 | 6.5 | 4.5 | 6.5 | 54.0 |
| Ca + Sr | | 16.3 | 11.4 | 15.6 | 17.3 | 15.6 | 16.4 | 13.4 | 14.5 |
| Na/(Li + Na + K + Mg + Ca + Sr + Ba) | | 0.184 | 0.160 | 0.160 | 0.192 | 0.160 | 0.160 | 0.160 | 0.160 |
| α[30-380° C.] (×$10^{-7}$/° C.) | | 83 | 82 | 83 | 84 | 81 | 82 | 82 | 82 |
| d(g/$cm^3$) | | 2.83 | 2.83 | 2.76 | 2.79 | 2.81 | 2.82 | 2.81 | 2.83 |
| Ps (° C.) | | 626 | 625 | 616 | 613 | 630 | 630 | 629 | 630 |
| Ta (° C.) | | 673 | 672 | 662 | 659 | 677 | 677 | 675 | 677 |
| Ts (° C.) | | 870 | 881 | 863 | 855 | 875 | 878 | 876 | 879 |
| $10^4$ dPa·s (° C.) | | 1,164 | 1,186 | 1,164 | 1,154 | 1,165 | 1,174 | 1,170 | 1,178 |
| $10^3$ dPa·s (° C.) | | 1,317 | 1,342 | 1,321 | 1,311 | 1,314 | 1,326 | 1,321 | 1,331 |
| $10^{2.5}$ dPa·s (° C.) | | 1,418 | 1,444 | 1,424 | 1,416 | 1,411 | 1,425 | 1,419 | 1,431 |
| $10^2$ dPa·s (° C.) | | 1,544 | 1,569 | 1,548 | 1,547 | 1,528 | 1,545 | 1,539 | 1,550 |
| TL (° C.) | | 1,098 | 1,126 | 1,112 | 1,109 | 1,121 | 1,098 | 1,135 | 1,096 |
| $\log_{10}\eta$TL (dPa·s) | | 4.6 | 4.5 | 4.4 | 4.4 | 4.4 | 4.7 | 4.3 | 4.7 |
| ρ (150° C.) | | 11.4 | 11.8 | 11.0 | 11.2 | 11.5 | Not measured | 11.7 | 11.6 |
| ρ (250° C.) | | 8.9 | 9.1 | 8.8 | 8.7 | 9.0 | Not measured | 9.1 | 9.0 |
| ρ (350° C.) | | 7.2 | 7.3 | 7.3 | 7.1 | 7.3 | Not measured | 7.3 | 7.3 |
| ε | | 7.8 | 7.8 | 7.6 | 7.7 | 7.8 | Not measured | 7.8 | 7.8 |
| tanδ | | 0.003 | 0.003 | 0.003 | 0.003 | 0.002 | Not measured | 0.002 | 0.003 |
| Young's modulus | | Not measured | Not measured | 80.0 | Not measured | 81.0 | Not measured | Not measured | 80.8 |
| Specific Young's modulus | | Not measured | Not measured | 29.0 | Not measured | 28.9 | Not measured | Not measured | 28.6 |

TABLE 9

| | | Example | | | | | | | |
|---|---|---|---|---|---|---|---|---|---|
| | | No. 62 | No. 63 | No. 64 | No. 65 | No. 66 | No. 67 | No. 68 | No. 69 |
| Glass composition (wt %) | $SiO_2$ | 50.7 | 51.0 | 51.0 | 51.0 | 51.0 | 50.0 | 50.0 | 53.0 |
| | $Al_2O_3$ | 13.0 | 12.0 | 13.0 | 13.0 | 12.0 | 12.0 | 12.0 | 13.0 |
| | MgO | 0.1 | 0.1 | 0.1 | 1.0 | 0.1 | 0.1 | 0.1 | 0.1 |
| | CaO | 3.4 | 3.9 | 5.4 | 4.5 | 3.9 | 3.9 | 3.9 | 5.4 |
| | SrO | 9.1 | 11.4 | 9.9 | 9.1 | 8.4 | 8.4 | 8.4 | 9.1 |
| | BaO | 8.3 | 5.5 | 5.5 | 6.3 | 8.5 | 9.5 | 8.5 | 6.3 |
| | $Na_2O$ | 5.0 | 5.5 | 5.5 | 5.0 | 5.5 | 5.5 | 5.5 | 5.0 |
| | $K_2O$ | 5.3 | 4.8 | 4.8 | 5.3 | 4.8 | 4.8 | 5.8 | 5.3 |
| | $ZrO_2$ | 4.6 | 5.6 | 4.6 | 4.6 | 5.6 | 5.6 | 5.6 | 2.6 |
| | $Fe_2O_3$ | 0.40 | 0.10 | 0.10 | 0.10 | 0.10 | 0.10 | 0.10 | 0.10 |
| | $SO_3$ | 0.10 | 0.10 | 0.10 | 0.10 | 0.10 | 0.10 | 0.10 | 0.10 |
| Si – Al | | 37.7 | 39.0 | 38.0 | 38.0 | 39.0 | 38.0 | 38.0 | 40.0 |
| Mg + Ca + Sr + Ba | | 20.9 | 20.9 | 20.9 | 20.9 | 20.9 | 21.9 | 20.9 | 20.9 |
| Mg + Ca | | 3.5 | 4.0 | 5.5 | 5.5 | 4.0 | 4.0 | 4.0 | 5.5 |
| Ca/Mg | | 34.0 | 39.0 | 54.0 | 4.5 | 39.0 | 39.0 | 39.0 | 54.0 |
| Ca + Sr | | 12.5 | 15.3 | 15.3 | 13.6 | 12.3 | 12.3 | 12.3 | 14.5 |
| Na/(Li + Na + K + Mg + Ca + Sr + Ba) | | 0.160 | 0.176 | 0.176 | 0.160 | 0.176 | 0.171 | 0.171 | 0.160 |
| α[30-380° C.] (×$10^{-7}$/° C.) | | 82 | 83 | 83 | 82 | 82 | 83 | 85 | 82 |

TABLE 9-continued

|  | Example | | | | | | | |
|---|---|---|---|---|---|---|---|---|
|  | No. 62 | No. 63 | No. 64 | No. 65 | No. 66 | No. 67 | No. 68 | No. 69 |
| d (g/cm$^3$) | 2.84 | 2.85 | 2.83 | 2.82 | 2.86 | 2.88 | 2.86 | 2.78 |
| Ps (°C.) | 628 | 628 | 628 | 626 | 625 | 624 | 620 | 614 |
| Ta (°C.) | 676 | 675 | 674 | 674 | 672 | 671 | 667 | 661 |
| Ts (°C.) | 884 | 876 | 873 | 880 | 877 | 874 | 871 | 864 |
| 10$^4$ dPa·s (°C.) | 1,197 | 1,176 | 1,180 | 1,180 | 1,180 | 1,172 | 1,173 | 1,166 |
| 10$^3$ dPa·s (°C.) | 1,358 | 1,328 | 1,336 | 1,336 | 1,335 | 1,325 | 1,327 | 1,330 |
| 10$^{2.5}$ dPa·s (°C.) | 1,464 | 1,428 | 1,439 | 1,438 | 1,437 | 1,425 | 1,427 | 1,436 |
| 10$^2$ dPa·s (°C.) | 1,594 | 1,550 | 1,565 | 1,563 | 1,562 | 1,544 | 1,549 | 1,561 |
| TL (°C.) | 1,106 | 1,076 | 1,096 | 1,098 | 1,071 | 1,079 | 1,077 | 1,114 |
| log$_{10}$ηTL (dPa·s) | 4.8 | 4.9 | 4.7 | 4.7 | 5.0 | 4.8 | 4.8 | 4.4 |
| ρ (150°C.) | 11.7 | Not measured | 11.6 | 11.8 | 11.7 | 11.8 | 11.8 | 11.5 |
| ρ (250°C.) | 9.1 | Not measured | 9.0 | 9.2 | 9.0 | 9.1 | 9.1 | 8.9 |
| ρ (350°C.) | 7.3 | Not measured | 7.2 | 7.4 | 7.2 | 7.3 | 7.3 | 7.2 |
| ε | 7.8 | Not measured | 7.8 | 7.8 | 7.9 | 7.9 | 7.9 | 7.6 |
| tanδ | 0.003 | Not measured | 0.003 | 0.003 | 0.003 | 0.002 | 0.002 | 0.003 |
| Young's modulus | Not measured | Not measured | Not measured | Not measured | 80.4 | 80.5 | 80.9 | Not measured |
| Specific Young's modulus | Not measured | Not measured | Not measured | Not measured | 28.1 | 27.9 | 28.3 | Not measured |

TABLE 10

|  |  | Example | | | | | | | |
|---|---|---|---|---|---|---|---|---|---|
|  |  | No. 70 | No. 71 | No. 72 | No. 73 | No. 74 | No. 75 | No. 76 | No. 77 |
| Glass composition (wt %) | SiO$_2$ | 50.5 | 53.0 | 53.6 | 51.0 | 53.5 | 51.0 | 49.1 | 50.1 |
|  | Al$_2$O$_3$ | 12.5 | 13.0 | 14.9 | 13.0 | 12.4 | 13.0 | 13.0 | 13.0 |
|  | B$_2$O$_3$ | — | — | — | — | — | — | 1.9 | 0.9 |
|  | MgO | 0.1 | 1.1 | 1.0 | 0.1 | 0.1 | 0.1 | 0.1 | 0.1 |
|  | CaO | 3.9 | 7.7 | 7.8 | 6.5 | 5.1 | 5.4 | 5.4 | 5.4 |
|  | SrO | 8.4 | 9.1 | 9.1 | 11.8 | 11.2 | 11.9 | 11.9 | 11.9 |
|  | BaO | 8.5 | 3.0 | 3.0 | 2.5 | 3.3 | 3.5 | 3.5 | 3.5 |
|  | Na$_2$O | 5.5 | 5.0 | 5.0 | 5.0 | 5.7 | 6.0 | 6.0 | 6.0 |
|  | K$_2$O | 4.8 | 5.3 | 5.3 | 5.3 | 4.1 | 4.3 | 4.3 | 4.3 |
|  | ZrO$_2$ | 5.6 | 2.6 | 0.1 | 4.6 | 4.4 | 4.6 | 4.6 | 4.6 |
|  | Fe$_2$O$_3$ | 0.10 | 0.10 | 0.10 | 0.10 | 0.01 | 0.01 | 0.01 | 0.01 |
|  | SO$_3$ | 0.10 | 0.10 | 0.10 | 0.10 | 0.19 | 0.19 | 0.19 | 0.19 |
| Si − Al |  | 38.0 | 40.0 | 38.7 | 38.0 | 41.1 | 38.0 | 36.1 | 37.1 |
| Mg + Ca + Sr + Ba |  | 20.9 | 20.9 | 20.9 | 20.9 | 19.7 | 20.9 | 20.9 | 20.9 |
| Mg + Ca |  | 4.0 | 8.8 | 8.8 | 6.6 | 5.2 | 5.5 | 5.5 | 5.5 |
| Ca/Mg |  | 39.0 | 7.0 | 7.8 | 65.0 | 51.0 | 54.0 | 54.0 | 54.0 |
| Ca + Sr |  | 12.3 | 16.8 | 16.9 | 18.3 | 16.3 | 17.3 | 17.3 | 17.3 |
| Na/(Li + Na + K + Mg + Ca + Sr + Ba) |  | 0.176 | 0.160 | 0.160 | 0.160 | 0.193 | 0.192 | 0.192 | 0.192 |
| α[30-380°C.] (×10$^{-7}$/°C.) |  | 82 | 83 | 84 | 83 | 81 | 83 | 84 | 84 |
| d (g/cm$^3$) |  | 2.86 | 2.75 | 2.71 | 2.81 | 2.79 | 2.82 | 2.82 | 2.82 |
| Ps (°C.) |  | 629 | 620 | 614 | 637 | 627 | 626 | 613 | 620 |
| Ta (°C.) |  | 676 | 665 | 660 | 683 | 674 | 672 | 656 | 665 |
| Ts (°C.) |  | 882 | 862 | 858 | 877 | 875 | 867 | 839 | 854 |
| 10$^4$ dPa·s (°C.) |  | 1,185 | 1,153 | 1,162 | 1,166 | 1,176 | 1,159 | 1,121 | 1,141 |
| 10$^3$ dPa·s (°C.) |  | 1,340 | 1,306 | 1,324 | 1,314 | 1,333 | 1,309 | 1,269 | 1,290 |
| 10$^{2.5}$ dPa·s (°C.) |  | 1,441 | 1,406 | 1,431 | 1,412 | 1,437 | 1,409 | 1,486 | 1,511 |
| 10$^2$ dPa·s (°C.) |  | 1,565 | 1,530 | 1,501 | 1,532 | 1,567 | 1,533 | 1,505 | 1,540 |
| TL (°C.) |  | 1,140 | 1,151 | 1,153 | 1,145 | 1,124 | 1,104 | 1,065 | 1,084 |
| log$_{10}$ηTL (dPa·s) |  | 4.4 | 4.0 | 4.1 | 4.2 | 4.4 | 4.5 | 4.5 | 4.5 |
| ρ (150°C.) |  | 11.6 | 11 | 11.1 | Not measured | 11.0 | 11.4 | 11.5 | 11.4 |
| ρ (250°C.) |  | 9 | 8.8 | 8.7 | Not measured | 8.6 | 8.9 | Not measured | Not measured |
| ρ (350°C.) |  | 7.2 | 7.3 | 7.2 | Not measured | 7.0 | 7.2 | Not measured | Not measured |
| ε |  | 7.8 | 7.6 | 7.5 | Not measured | 7.7 | 7.8 | 7.6 | 7.6 |
| tanδ |  | 0.003 | 0.003 | 0.003 | Not measured | 0.004 | 0.003 | Not measured | Not measured |

TABLE 11

|  |  | Example | Comparative Example | |
|---|---|---|---|---|
|  |  | No. 78 | No. 79 | No. 80 |
| Glass composition (wt %) | $SiO_2$ | 50.6 | 55.8 | 57.8 |
|  | $Al_2O_3$ | 13.0 | 7.0 | 7.0 |
|  | $B_2O_3$ | 0.4 | — | — |
|  | MgO | 0.1 | 2.0 | 2.0 |
|  | CaO | 5.4 | 2.0 | 5.0 |
|  | SrO | 11.9 | 9.0 | 7.0 |
|  | BaO | 3.5 | 8.5 | 8.0 |
|  | $Na_2O$ | 6.0 | 4.5 | 4.0 |
|  | $K_2O$ | 4.3 | 6.5 | 7.0 |
|  | $ZrO_2$ | 4.6 | 4.5 | 2.0 |
|  | $Fe_2O_3$ | 0.01 | 0.10 | 0.10 |
|  | $SO_3$ | 0.19 | 0.10 | 0.10 |
| Si – Al |  | 37.6 | 48.8 | 50.8 |
| Mg + Ca + Sr + Ba |  | 20.9 | 21.5 | 22.0 |
| Mg + Ca |  | 5.5 | 4.0 | 7.0 |
| Ca/Mg |  | 54.0 | 1.0 | 2.5 |
| Ca + Sr |  | 17.3 | 11.0 | 12.0 |
| Na/(Li + Na + K + Mg + Ca + Sr + Ba) |  | 0.192 | 0.138 | 0.121 |
| α[30-380° C.] (×$10^{-7}$/° C.) |  | 84 | 85 | 85 |
| d(g/cm³) |  | 2.82 | 2.82 | 2.77 |
| Ps (° C.) |  | 623 | 580 | 570 |
| Ta (° C.) |  | 669 | 630 | 620 |
| Ts (° C.) |  | 861 | 840 | 830 |
| $10^4$ dPa·s (° C.) |  | 1,151 | 1,150 | 1,130 |
| $10^3$ dPa·s (° C.) |  | 1,300 | 1,310 | 1,300 |
| $10^{2.5}$ dPa·s (° C.) |  | 1,523 | 1,410 | 1,400 |
| $10^2$ dPa·s (° C.) |  | 1,550 | Not measured | Not measured |
| TL(° C.) |  | 1,094 | Not measured | Not measured |
| $\log_{10}\eta TL$ (dPa·s) |  | 4.5 | Not measured | Not measured |
| ρ (150° C.) |  | 11.4 | Not measured | Not measured |

TABLE 12

|  |  | Example | | | |
|---|---|---|---|---|---|
|  |  | No. 81 | No. 82 | No. 83 | No. 84 |
| Glass composition (wt %) | $SiO_2$ | 51.0 | 51.2 | 50.9 | 50.2 |
|  | $Al_2O_3$ | 13.0 | 13.0 | 14.0 | 13.0 |
|  | $B_2O_3$ | — | — | — | — |
|  | MgO | 0.1 | 0.1 | 0.1 | 0.1 |
|  | CaO | 5.5 | 5.3 | 4.8 | 5.5 |
|  | SrO | 12.0 | 12.0 | 11.0 | 12.0 |
|  | BaO | 3.0 | 4.0 | 3.0 | 3.0 |
|  | $Na_2O$ | 6.5 | 7.0 | 8.0 | 7.3 |
|  | $K_2O$ | 3.7 | 3.2 | 3.0 | 4.2 |
|  | $ZrO_2$ | 5.0 | 4.0 | 5.0 | 4.5 |
|  | $Fe_2O_3$ | 0.1 | 0.1 | 0.1 | 0.1 |
|  | $SO_3$ | 0.1 | 0.1 | 0.1 | 0.1 |
| Si – Al |  | 38.0 | 38.2 | 36.9 | 37.2 |
| Mg + Ca + Sr + Ba |  | 20.6 | 21.4 | 18.9 | 21.0 |
| Mg + Ca |  | 5.6 | 5.4 | 4.9 | 6 |
| Ca/Mg |  | 55 | 53 | 48 | 55.0 |
| Ca + Sr |  | 17.5 | 17.3 | 15.8 | 18 |
| Na/(Li + Na + K + Mg + Ca + Sr + Ba) |  | 0.211 | 0.222 | 0.268 | 0.227 |
| α[30-380° C.] (×$10^{-7}$/° C.) |  | 84 | 86 | 87 | 86 |
| d(g/cm³) |  | 2.82 | 2.82 | 2.81 | 2.83 |
| Ps (° C.) |  | 626 | 611 | 612 | 612 |
| Ta (° C.) |  | 671 | 656 | 657 | 657 |
| Ts (° C.) |  | 866 | 851 | 852 | 849 |
| $10^4$ dPa·s (° C.) |  | 1,157 | 1,139 | 1,144 | 1,140 |
| $10^3$ dPa·s (° C.) |  | 1,304 | 1,289 | 1,299 | 1,285 |
| $10^{2.5}$ dPa·s (° C.) |  | 1,403 | 1,390 | 1,403 | 1,382 |
| $10^2$ dPa·s (° C.) |  | 1,521 | 1,490 | 1,520 | 1,500 |
| TL(° C.) |  | 1,111 | 1,093 | 1,096 | 1,100 |
| $\log_{10}\eta TL$ (dPa·s) |  | 4.4 | 4.4 | 4.4 | 4.40 |
| ρ (150° C.) |  | 11.6 | 11.5 | 11.4 | 11.3 |
| ρ (250° C.) |  | 8.5 | 8.4 | 8.3 | 8.3 |
| ρ (350° C.) |  | 7.1 | 7.0 | 6.0 | 6.8 |
| ∈ |  | 7.8 | 7.7 | 7.8 | 7.8 |
| tanδ |  | 0.003 | 0.003 | 0.003 | 0.003 |

Sample Nos. 46 to 84 were produced in the following manner. First, glass batches were blended so that each of the glass compositions in the tables was attained, and then the glass batches were loaded into a platinum crucible and were melt at 1,550° C. for 2 hours. Next, the resultant molten glass was caused to flow on a carbon plate to be formed into a plate shape, followed by annealing. After that, predetermined processing was performed in accordance with each measurement. Each of the resultant samples was evaluated for its thermal expansion coefficient α, density d, strain point Ps, annealing temperature Ta, softening temperature Ts, temperature at $10^4$ dPa·s, temperature at $10^3$ dPa·s, temperature at $10^{2.5}$ dPa·s, temperature at $10^2$ dPa·s, liquidus temperature TL, liquidus viscosity $\log_{10} \eta TL$, volume electric resistivities ρ (150° C., 250° C., 350° C.), dielectric constant ∈, dielectric dissipation factor tan δ, Young's modulus, and specific Young's modulus. Table 1 to 6 show those results.

The thermal expansion coefficient α refers to an average thermal expansion coefficient in the temperature range of 30 to 380° C. calculated from the values measured with a dilatometer. Note that a cylindrical sample having a diameter of 5.0 mm and a length of 20 mm was used as a measurement sample.

The density d refers to a value measured by a well-known Archimedes method.

The strain point Ps, the annealing temperature Ta, and the softening temperature Ts are values measured on the basis of ASTM C336-71.

The temperature at $10^4$ dPa·s, the temperature at $10^3$ dPa·s, and the temperature at $10^{2.5}$ dPa·s are values measured by a platinum sphere pull up method. Note that the temperature at $10^4$ dPa·s corresponds to a formation temperature.

The liquidus temperature TL refers to a value obtained by measuring a temperature at which crystals of glass are deposited after glass powder that passed through a standard 30-mesh sieve (500 μm) and remained on a 50-mesh sieve (300 μm) is placed in a platinum boat and then the platinum boat is kept for 24 hours in a gradient heating furnace. The liquidus viscosity $\log_{10} \eta TL$ refers to a value obtained by measuring the viscosity of glass at a liquidus temperature TL by a platinum sphere pull up method. Note that, as the liquidus temperature is lower or as the liquidus viscosity is higher, the denitrification resistance improves, and hence devitrified crystals are difficult to precipitate in glass at the time of the forming thereof. As a result, large glass sheets can be easily manufactured at low cost.

The volume electric resistivity ρ refers to a value measured on the basis of ASTM C657-78 at each temperature.

The dielectric constant ∈ and the dielectric dissipation factor tan δ refer to values measured under the conditions of 25° C. and 1 MHz on the basis of ASTM D150-87.

The Young's modulus refers to a value measured by a resonance method. In addition, the specific Young's modulus refers to a value obtained by dividing the Young's modulus by the density.

As evident from Tables 7 to 12, each of Sample Nos. 46 to 78 and 81 to 84 has a strain point of more than 600° C. to 650° C., thus having high heat resistance. Further, each of Sample Nos. 46 to 78 and 81 to 84 has a thermal expansion coefficient of $70 \times 10^{-7}$ to $100 \times 10^{-7}$/° C., and hence the thermal expansion coefficient easily matches those of constituent members in a PDP or the like. In addition, each of Sample Nos. 46 to 78 and 81 to 84 has a temperature at $10^4$ dPa·s of less than 1,200° C. and has a liquidus viscosity of $10^{4.0}$ dPa·s or more, and hence each of the samples is excellent in productivity.

Each of Sample Nos. 79 and 80 has a strain point of about 580° C. or less, and hence each of the samples has thermal shrinkage to a large extent in a heat treatment step, with the result that it may be difficult to manufacture a high-definition display or the like by using those samples.

Note that Sample Nos. 79 and 80 are general-purpose glass.

Sample No. 82 had a content of MgO out of the predetermined range, and hence devitrified crystals of the $ZrO_2$ system were liable to precipitate. In addition, the sample had a high liquidus temperature.

Sample No. 83 has too low a content of SrO, and hence a high temperature at $10^4$ dPa·s, with the result that the production cost of glass may significantly increase.

The invention claimed is:

1. A glass sheet for a thin-film solar cell, comprising, as a glass composition in terms of mass %, 45 to 60% of $SiO_2$, more than 8.0 to 14.5% of $Al_2O_3$, 0 to less than 15% of $B_2O_3$, 15 to 40% of MgO+CaO+SrO+BaO, 0 to 10% of MgO+CaO, 0 to 30% of CaO+SrO, and 7 to 30% of $Na_2O+K_2O$, and having a strain point of more than 580° C., wherein the glass sheet for a thin-film solar cell has 28 to 50% of $SiO_2$—$Al_2O_3$, and has a mass ratio CaO/MgO of more than 1.0.

2. The glass sheet for a thin-film solar cell according to claim 1, wherein the glass sheet for a thin-film solar cell has a mass ratio $Na_2O$/(MgO+CaO+SrO+BaO+$Li_2O$+$Na_2O$+$K_2O$) of 0.05 to 0.5.

3. The glass sheet for a thin-film solar cell according to claim 1, further comprising 0.01 to 1% of $Fe_2O_3$.

4. The glass sheet for a thin-film solar cell according to claim 1, wherein the glass sheet for a thin-film solar cell further comprises 0.01 to 1% of $SO_3$ and is formed by a float method.

5. The glass sheet for a thin-film solar cell according to claim 1, wherein the glass sheet for a thin-film solar cell has a strain point of greater than 600° C. and less than or equal 650° C.

6. The glass sheet for a thin-film solar cell according to claim 1, wherein the glass sheet for a thin-film solar cell has an average thermal expansion coefficient of 70 to $100 \times 10^{-7}$/° C. from 30 to 380° C.

7. The glass sheet for a thin-film solar cell according to claim 1, wherein the glass sheet for a thin-film solar cell has a temperature at $10^{4.0}$ dPa·s of 1,200° C. or less.

8. The glass sheet for a thin-film solar cell according to claim 1, wherein the glass sheet for a thin-film solar cell has a liquidus viscosity of $10^{4.0}$ dPa·s or more.

9. The glass sheet for a thin-film solar cell according to claim 1, wherein the glass sheet for a thin-film solar cell comprises a film having an average thermal expansion coefficient of 60 to $120 \times 10^{-7}$/° C. from 30 to 380° C. and formed at a film formation temperature of 500 to 700° C.

10. The glass sheet for a thin-film solar cell according to claim 1, wherein the glass sheet for a thin-film solar cell undergoes no chemical tempering treatment.

11. The glass sheet for a thin-film solar cell according to claim 1, wherein the glass sheet for a thin-film solar cell is used in a CIS-based solar cell.

12. The glass sheet for a thin-film solar cell according to claim 1, wherein the glass sheet for a thin-film solar cell is used in a CdTe-based solar cell.

* * * * *